US007064076B2

(12) United States Patent
Kulkarni

(10) Patent No.: US 7,064,076 B2
(45) Date of Patent: Jun. 20, 2006

(54) PROCESS FOR LOW TEMPERATURE, DRY ETCHING, AND DRY PLANARIZATION OF COPPER

(76) Inventor: Nagraj Kulkarni, 9635 Cedar Valley Way, Knoxville, TN (US) 37931

( * ) Notice: Subject to any disclaimer, the term of this patent is extended or adjusted under 35 U.S.C. 154(b) by 180 days.

(21) Appl. No.: 10/285,179

(22) Filed: Oct. 31, 2002

(65) Prior Publication Data

US 2003/0098292 A1    May 29, 2003

Related U.S. Application Data

(60) Provisional application No. 60/335,641, filed on Oct. 31, 2001.

(51) Int. Cl.
*H01L 21/302* (2006.01)

(52) U.S. Cl. .......................... 438/714; 216/62; 216/67; 216/78; 438/705; 438/720; 438/734

(58) Field of Classification Search ................ 438/714, 438/692, 704, 720, 734, 705; 216/67, 78, 216/62

See application file for complete search history.

(56) References Cited

U.S. PATENT DOCUMENTS

| 4,919,750 | A | * | 4/1990 | Bausmith et al. ............. 216/66 |
| 5,431,774 | A | * | 7/1995 | Douglas ....................... 216/57 |
| 5,515,985 | A | | 5/1996 | Ohshita et al. |
| 6,057,230 | A | | 5/2000 | Liu |
| 6,489,247 | B1 | * | 12/2002 | Ye et al. ...................... 438/714 |
| 6,547,978 | B1 | * | 4/2003 | Ye et al. ........................ 216/75 |

FOREIGN PATENT DOCUMENTS

JP         08-111420       *   4/1996

OTHER PUBLICATIONS

"Low Temperature Copper Etching Via Reactions With Cl2 and PEt3 Under Ultrahigh Vacuum Conditions"; Journal of Applied Physics; vol. 73; No. 3; Farkas et. al.; (Feb. 1993'); pp. 1455-1460.*
Shannon, "Techniques to Improve Cu/Low-k Integration," *Solid State Technol.*, 44, S22, (2001).

(Continued)

*Primary Examiner*—George A. Goudreau
(74) *Attorney, Agent, or Firm*—Saliwanchik, Lloyd & Saliwanchik

(57) ABSTRACT

The subject invention pertains to a method and apparatus for etching copper (Cu). The subject invention can involve passing a halide gas over an area of Cu such that CuX, or CuX and $CuX_2$, are formed, where X is the halide. Examples of halides which can be utilized with the subject matter include, but are not necessarily limited to, Cl, Br, F, and I. Once the CuX, or CuX and $CuX_2$, are formed the subject invention can then involve passing a reducing gas over the area of Cu for a sufficient time to etch away at least a portion of the CuX, or $CuX_2$, respectively. With respect to a specific embodiment in which CuX and $CuX_2$ are produced when the halide gas is passed over the area of Cu, the reducing gas can be passed until essentially all of the $CuX_2$ is etched and at least a portion of the CuX is etched. Examples of reducing gases which can be utilized with the subject invention include, but are not necessarily limited to, hydrogen gas and hydrogen gas plasma. The subject invention can accomplish the etching of Cu by passing the reducing gas over the Cu so as to be on a $CuX_2$—$Cu_3X_2$ metastable line when etching $CuX_2$ and to be a CuY—CuX metastable line, where Y is the reducing gas element, when etching CuX. FIGS. 5, 6, and 8, show such metastable lines for Cu, with X being Cl, from temperatures ranging from 50° C. to 200° C. These can be extrapolated to other temperatures, for other halides, and/or other reducing gases. The subject invention can be used to, for example, etch partial into a layer of Cu, through a layer of Cu, or to smooth a Cu surface.

22 Claims, 8 Drawing Sheets

OTHER PUBLICATIONS

Jung, et al. (May/Jun. 1997) "Patterning of Cu, Co, Fe, and Ag for Magnetic Nanostructures", (43rd National Symposium of the American Vacuum Society, Philadelphia, PA, USA, Oct. 14-18, 1996) vol. 15(3): 1780-1784, J. Vac. Sci. Technol.

Jung et al., "Long Term Stability of Dry Etched Magnetoresistive Random Access Memory Elements" vol. 18(1): 268-272, J. Vac. Sci. Technol. Jan./Feb. 2000 vol. 18, p. 1.

Mukherjee, et al., "Planarization of Copper Damascene Interconnects by Spin-Etch Process: A Chemical Approach," *Materials Research Society Symposium Proceedings*, 613, E8.10.1. (2000).

Banerjee et al., "Simultaneous Optimization of Electroplating and CMP for Copper Processes," *Solid State Technol.*, 44, 83, (2001).

Braun et al., "CMP faces Low-k, Fundamental Barriers" *Semiconductor International*, 23, 66 (2000).

Wang et al., "Advanced Processing: CMP of Cu/Low-k and Cu/Ultralow-k layers," *Solid State Technol.*, 44, S9, (2001).

Braun, "ECP Technology faces Chemical, Dielectric Hurdles," *Semiconductor International*, 23, 60 (2000).

Magg et al., "Assessing the Environmental Impact of Copper CMP," *Semiconductor International*, 23, 101 (2000).

Golden et al., "Evaluating and Treating CMP Wastewater," *Semiconductor Intenational*, 23, 85, (2000).

Guha et al., "Navigating Yeild through the Maze of Copper CPM Defects," *Solid State Technol.*, 44, 63, (2001).

Gulbransen, "Thermochemistry and the Oxidation of Refractory Metals at High Temperature," *Corrosion*, 26, 19 (1970).

Gulbransen et al., "High-Temperature Oxidation, Reduction and Volatization Reactions of Silicon and Silicon Carbide," *Oxid Metals*, 4, 181, (1972).

Jannsson, "Thermochemistry of Liquid Metal-Gas Crucible Reactions in Vacuum," *J. Vac. Sci. Technol.*, 7, S5 (1970).

Heuer et al., "Volatility Diagrams for Silica, Silicon Nitride, and Silicon Carbide and Their Application to High-Temperature Decomposition and Oxidation," *J. Am. Cerem. Soc.*, 73, 2785, (1990).

Wang et al., "Stress-Free Polishing Advances Copper Integration with Ultralow-k Dielectrics," *Solid State Technol.*, 44, 101, (2001).

Kulkarni, N.S. and DeHoff, R.T., "Application of Volatility Diagrams for Low Temperature, Dry Etching of Copper," *Journal of the Electrochemical Society*, 149 (11) G620-632 (2002).

* cited by examiner

PROCESS FOR LOW TEMPERATURE, DRY ETCHING, AND DRY PLANARIZATION OF COPPER

CROSS REFERENCE TO RELATED APPLICATIONS

This application claims the benefit of provisional patent application Ser. No. 60/335,641, filed Oct. 31, 2001, which is hereby incorporated by reference in its entirety.

BACKGROUND

Background for the subject technology can be found in the pioneering work by the late Carl Wagner [32] on the active-passive oxidation of Si and the work by Lou, Mitchell and Heuer [33] on treatment of volatility diagrams.

The replacement of aluminum with copper as an interconnect material in ULSI structures is being actively considered in the semiconductor industry [1–7]. Compared to aluminum, copper has a lower electrical resistivity and significantly larger electromigration resistance. The utilization of copper interconnects is expected to improve chip performance due to lower RC time delays and power dissipation. Two basic processes for copper-based interconnect structures have been proposed [2–6]. The first is the dual damascene method, which has been recently introduced in IC manufacturing by IBM and others [2]. In this method for producing multilevel structures, the dielectric layer is first deposited on the silicon substrate. The via pattern is then formed by dry etching of the dielectric. A thin diffusion barrier (e.g., TaN) is subsequently deposited on the patterned dielectric followed by deposition of copper using blanket CVD, PVD or electroplating techniques. The excess copper on top of the features is finally removed by a process of chemical mechanical polishing (CMP).

The second process for the patterning of copper is the dry etch method [3–5], which is based on the process used for the patterning of aluminum [8–10]. In this process, copper is first deposited on the dielectric having a barrier layer using, for example, a sputtering process. A hard mask or photoresist is applied over the copper and the pattern is etched using a dry etch process such as reactive ion etching(RIE). The structure is then filled with dielectric and planarized using CMP.

Unfortunately, unlike aluminum, the anisotropic dry etching process for copper using halides is difficult at low temperatures due to the lower volatility of copper based compounds [5, 11–14]. At wafer temperatures of 200° C. or higher, reactive ion etching of copper in the presence of chlorine can be achieved, but the anisotropy is lost due to problems associated with the use of organic mask layers. Inorganic mask layers have been utilized, however they appear to provide less etch anisotropy due to the lack of protective sidewall films. Higher temperatures have a negative effect on the electrical conductivity of copper due to the increased solubility of chlorine in copper and can also cause significant problems due to dopant diffusion and stress on equipment and components during manufacturing. Redeposition of the copper chlorides from the warm exhaust gas stream on cooler equipment components is a serious issue associated with high temperature etching. The continued corrosion of the patterned copper due to the precipitation of copper chloride compounds (15) on cooling to room temperature is yet another problem. Thus lower etching temperatures are desirable.

The continued corrosion of the patterned copper during the etch process itself has been reported to be an important problem. One would expect that this problem can be easily resolved by ensuring that the nonvolatile copper chlorides are removed on completion of the etch to prevent further corrosion. However this problem needs to be considered carefully. The existing dry etch processes for Cu are usually carried out at higher temperatures (typically>200° C.). Hence the solubility of chlorine in copper is much higher or alternatively the diffusion depth of chlorine in copper is significant compared to lower temperatures. On cooling down to room temperature, the solubility of chlorine in copper is reduced and as a result the excess chlorine may precipitate in the form of copper chlorides causing further corrosion. To prevent this from occurring, the residual chlorine in the etched copper has to be removed by exposing to a reducing atmosphere such as hydrogen or by further etching of the copper containing the dissolved chlorine without the use of chlorine, in effect using natural volatilization (a process which is extremely slow). Such a process besides causing problems with dimensional control would require a significant amount of time, since it is known that the diffusivity of chlorine in copper is very low (perhaps more than two orders of magnitude lower than that of copper at room temperature [15]). A dry etch process for copper at lower temperatures besides being beneficial in relation to the thermal cost, has the advantage that the diffusion depth of chlorine in copper is reduced, and hence corrosion problems due to the reasons stated earlier are expected to be less severe. Hence, the development of a cost-effective, low-temperature, dry etch process for copper is highly desirable. This appears to be elusive at the present time.

An important advantage of the damascene process is that the copper does not have to be patterned directly and so the problems associated with the dry etching of copper are avoided. The number of processing steps, as compared to the dry etching process, is also reduced [2]. However, there are some challenging issues associated with the Cu deposition for very small feature sizes (less than 0.25 µm) and high aspect ratios [16,17] as well as difficulties associated with the copper CMP process [16,18–19] and the safe disposal of the byproducts of the electroplating process [20,21]. The practical problems and costs associated with the transition to the new technology based on the copper damascene process are still being evaluated with copper CMP regarded as the major bottleneck [16,19,22]. Furthermore, the introduction of porous, low dielectric constant materials is expected to pose significant challenges to the copper CMP process in the near future [18].

In comparison, if a cost-effective, low temperature dry etching process for copper can be developed, many of the problems associated with copper damascene can be avoided. Besides, the transition may be relatively easier and cheaper since essentially the same equipment and processes used for the patterning of aluminum can be utilized. An obvious benefit of the dry process, as compared to the damascene process, is that there is considerable experience in handling of the disposed gases using safe and environment-friendly procedures. It has been recently reported [12] that dry etch patterning can be readily combined with air gaps, which is an important advantage over the damascene process, since air gaps reduce capacitance and leakage current between lines. An added benefit of this innovation is that no barrier films on the sidewalls of the copper lines are needed.

In spite of the difficulties with copper reactive ion etching, several approaches have been proposed. Most of these utilize temperatures over 150° C. to improve the volatility of the copper chloride gas species. Winters [23] suggested a two-step process, that first required the formation of CuCl at room temperature followed by heating between 150–200° C. to desorb $Cu_3Cl_3(g)$, which he identified as the primary desorbing species. Arita et al. [5] and Igarashi et al. [24] used a gas mixture of $SiCl_4$, $Cl_2$, $N_2$, and $NH_3$ for dry etching and used a resist mask by hard-baking above 250° C. Since copper was oxidized during the ashing process for resist removal, they suggested a CVD $SiO_2$ film or a plasma CVD nitride mask which could remain in place after the RIE. A thin SiON film that formed on the sidewall acted as a suitable barrier during the etching process. Miyazaki et al. [14] were able to obtain an anisotropic etch profile using chlorine as the only reactant. The operating temperature (230–270° C.) and the partial pressure of chlorine (0.3–1.3 Pa) had to carefully controlled in their process. Markert et al. [12] used an ICP system containing a chlorine-based gas mixture (10–20 mtorr) along with Ar and $N_2$ at a wafer temperature of 250° C. $CH_4$ was used to protect the sidewall during the etch. Ye et al. [25] utilized a mixture of HCl or HBr along with hydrogen as the reactant gases at temperatures greater than 150° C. Jain et al. [26] used a two-step process for the isotropic etching of copper, first by oxidizing copper using hydrogen peroxide followed by its removal using hexafluoroacetylacetone (hfacH). A continuous process using the same reactants at 150° C. was also proposed by them. Lee et al. [27] performed a RIE etch using a $CCl_4/N_2$ electron cyclotron plasma (ECR) at temperatures above 210° C.

Low temperature methods for the etching of copper usually require some form of radiation such as ultraviolet [28–29], infrared [30] or laser [31], to enhance the volatilization of the etch products. It is reported that these do not have good etch uniformity for large-area substrates and the processes are not easy to control and maintain [32]. Kuo and Lee [32, 33], and Allen and Grant [34] suggested a process in which $CuCl_x$ was intentionally formed by exposing to a chlorine plasma and then chemically etched using HCl or other solutions [34]. Temperatures ranging from 25–250° C. were utilized by Kuo and Lee with the higher temperatures being more effective. Surface roughness along the sidewalks appears to be an important issue in their process.

One of the problems in understanding the etching process in the Cu—Cl system is that it is not clear which Cu gaseous species is responsible for the primary etching mechanism. It has been reported that the trimer $Cu_3Cl_3$ is the dominant gas species in this system [5,23], however the precise conditions (i.e., chlorine partial pressure and temperature) for which this species dominates appears to have not been analyzed systematically. The difficulty arises because there are a large number of gaseous (Cu(g), CuCl(g), $CuCl_2(g)$, $Cu_3Cl_3(g)$), etc.) and condensed (solid) phase species (Cu(c)*, CuCl(c), $CuCl_2(c)$) in this system. Experiments involving mass spectrometric measurements of the partial pressures of gases along with other techniques to determine the condensed phase species are certainly helpful, however these can be quite tedious. Theoretical approaches based on the thermodynamics of this system may be preferable provided the thermodynamic data is available. Fortunately, for the Cu—Cl system, the thermodynamic data has been assessed and is available through a number of sources, for e.g., JANAF tables [35] or databases accompanying thermodynamic software such as HSC Chemistry [36] and FACT [37]. In spite of this, it is still not a trivial task sorting through the list of reactions and determining the dominant condensed and vapor phase species at various temperatures and chlorine partial pressures. A graphical representation is probably the best approach. Conventional phase diagrams, Richardson-Ellingham diagrams and Pourbaix diagrams [38] are a few examples of such graphical representations that are useful in various areas of research. In the present situation, an appropriate graphical method for representation of solid-gas reactions, so as to understand etching mechanisms, is a "volatility diagram." Volatility diagrams are typically used in the high-temperature industry to examine volatility behavior of materials such as refractories and ceramics when exposed to high temperatures and reactive environments [39–44]. The earliest works in this field appear to be those of Wagner (39) who utilized such a diagram for analyzing the active-passive oxidation of silicon. Gulbransen and Jansson (40–42) used these diagrams (also known as thermochemical diagrams) for the analysis of volatility behavior of refractory metals (40), ceramics (41) and liquid metals (42). Typically, in a volatility diagram, for example the Si—O system, the partial pressures of the important volatile species that contain the solid element (e.g., Si(g), SiO(g)) are plotted as a function of the partial pressure of oxygen at various temperatures. A comprehensive review of the construction and application of volatility diagrams for ceramic materials is given in the paper by Lou, Mitchell and Heuer (43, 44). The present work extends the use of volatility diagrams for understanding dry etching mechanisms in the Cu—Cl system.

SUMMARY OF THE INVENTION

The subject invention pertains to a method and apparatus for etching copper (Cu). The subject invention can involve passing a halide gas over an area of Cu such that CuX, or CuX and $CuX_2$, are formed, where X is the halide. Examples of halides which can be utilized with the subject matter include, but are not necessarily limited to, Cl, Br, F, and I. Once the CuX, or CuX and $CuX_2$, are formed the subject invention can then involve passing a reducing gas over the area of Cu for a sufficient time to etch away at least a portion of the CuX, or $CuX_2$, respectively. With respect to a specific embodiment in which CuX and $CuX_2$ are produced when the halide gas is passed over the area of Cu, the reducing gas can be passed until essentially all of the $CuX_2$ is etched and at least a portion of the CuX is etched. Examples of reducing gases which can be utilized with the subject invention include, but are not necessarily limited to, hydrogen gas and hydrogen gas plasma. The subject invention can accomplish the etching of Cu by passing the reducing gas over the Cu so as to be on a $CuX_2$—$Cu_3X_3(g)$ metastable line when etching $CuX_2$ and to be on a CuX—CuY(g) metastable line, where Y is the reducing gas element, when etching CuX. FIGS. 5, 6, and 8, show such metastable lines for Cu, with X being Cl, from temperatures ranging from 50° C. to 200° C. These can be extrapolated to other temperatures, for other halides,and/or other reducing gases. The subject invention can be used to, for example, etch partial into a layer of Cu, through a layer of Cu, or to smooth a Cu surface.

The volatility diagram for Cu—Cl was constructed at temperatures between 50 and 200° C. based on the procedure developed by Lou, Mitchell and Heuer [43,44]. Examination of the volatility diagram revealed that $Cu_3Cl_3(g)$ had the highest vapor pressure. However the equilibrium vapor pressure of $Cu_3Cl_3(g)$ is not sufficient for the purpose of dry etching of copper at temperatures below 200° C. At temperatures greater than 200° C. and with chlorine pressures lower than that given by the isomolar point (FIG. 3), it is possible to etch copper without the formation of CuCl(c), due to the active oxidation of copper involving the Cu(c)-

$Cu_3Cl_3(g)$ vaporization reaction. The subject invention relates to the etching of copper at low temperatures (25° C.) by using the metastable $CuCl_2(c)$-$Cu_3Cl_3(g)$ volatilization reaction in the presence of hydrogen (FIGS. 5, 6). In a specific embodiment, the subject invention relates to a multi-step etch process (FIG. 10), which first includes the rapid and preferential formation of $CuCl_2(c)$ followed by its removal using the above reaction. The successful implementation of this low-temperature, dry etch process can provide a rapid, cost-effective and environment-friendly alternative to the Cu damascene process. A further application of this multi-step process for the reactive ion planarization (RIP) of copper may offer an attractive alternative to the chemical mechanical planarization (CMP) step in the damascene process.

DETAILED DESCRIPTION OF THE INVENTION

Figure 5:
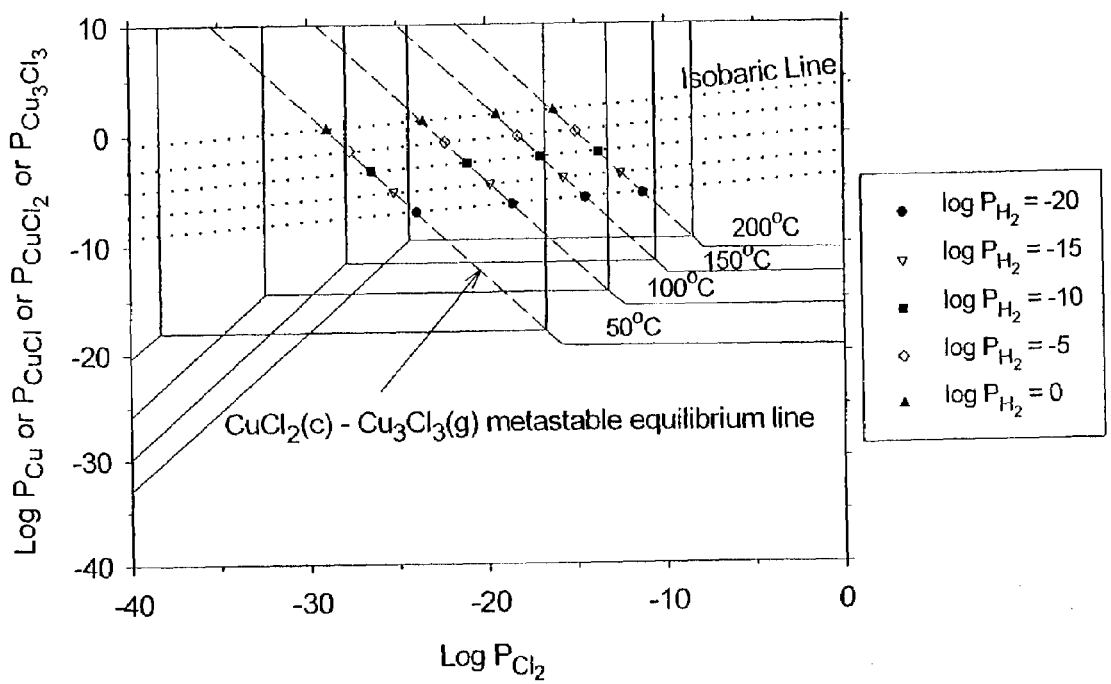
FIG. 5 is a volatility diagram for the Cu—Cl system showing the isobaric lines for various partial pressures of hydrogen (in atm) for the reaction $3CuCl_2(c)+\frac{3}{2}H_2(g)=Cu_3Cl_3(g)+3HCl(g)$. The isobaric lines are obtained by joining the isobaric points (symbols), which indicate the maximum vapor pressure of $Cu_3Cl_3(g)$ over $CuCl_2(c)$, allowed for a given hydrogen partial pressure at a specific temperature. With reference to the above reaction, the isobaric point is obtained with the assumption $P_{HCl}=3P_{Cu_3Cl_3}$. It is clear that very high partial pressures of $Cu_3Cl_3(g)$ are achievable at low temperatures in a hydrogen-based reducing environment, hence higher etch rates for copper can be obtained.
Figure 6:
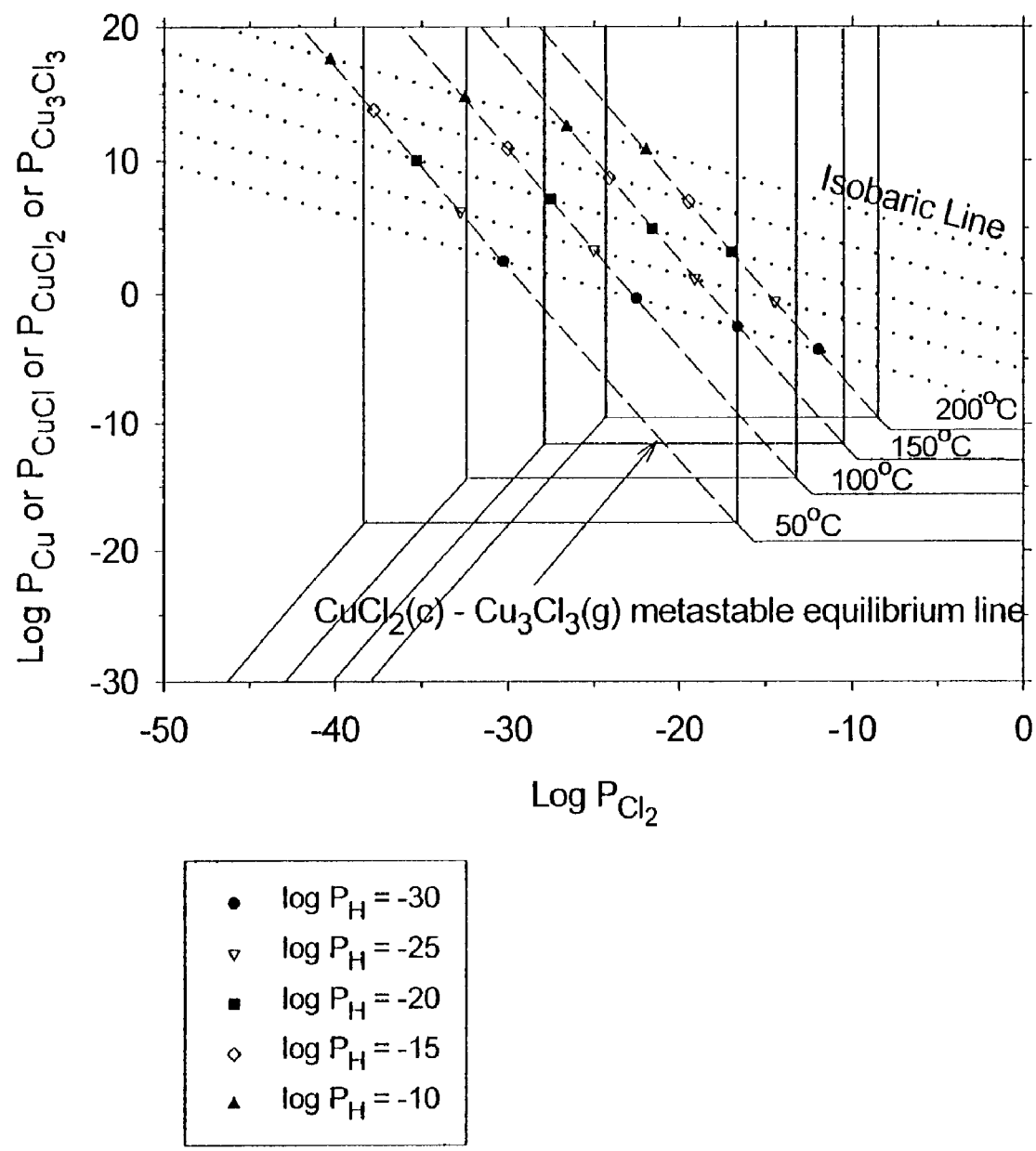
FIG. 6 is a volatility diagram for the Cu—Cl system showing the isobaric lines for various partial pressures of atomic hydrogen (in atm) for the reaction $3Cu_3Cl_2(c)+3H(g)=Cu_3Cl_3(g)+3HCl(g)$. The isobaric lines are obtained in a manner similar to FIG. 5 using the same mass balance criterion $P_{HCl}=3P_{Cu_3Cl_3}$. The isobaric lines have a negative slope, which is in contrast to the isobaric lines in FIG. 5. As a result, the $Cu_3Cl_3(g)$ pressure for a given pressure of atomic hydrogen, $H(g)$, decreases as the temperature is increased. Extremely high $Cu_3Cl_3(g)$ pressures over $CuCl_2(c)$ are obtained in this atomic hydrogen environment at low temperatures, as a result the etch rates for $CuCl_2(c)$ and hence copper are expected to be high.

The subject invention pertains to a method and apparatus for etching copper (Cu). The subject invention can involve passing a halide gas over an area of Cu such that CuX, or CuX and $CuX_2$, are formed, where X is the halide. Examples of halide which can be utilized with the subject matter include, but are not necessarily limited to, Cl, Br, F, and I. Once the CuX, or CuX and $CuX_2$, are formed the subject invention can then involve passing a reducing gas over the area of Cu for a sufficient time to etch away at least a portion of the CuX, or $CuX_2$, respectively. With respect to a specific embodiment in which CuX and $CuX_2$ are produced when the halide gas is passed over the area of Cu, the reducing gas can be passed until essentially all of the $CuX_2$ is etched and at least a portion of the CuX is etched. Examples of reducing gases which can be utilized with the subject invention include, but are not necessarily limited to, hydrogen gas and hydrogen gas plasma. The subject invention can accomplish the etching of Cu by passing the reducing gas over the Cu so as to be on a $CuX_2$—$Cu_3X_3(g)$ metastable line when etching $CuX2$ and to be on a $CuX$—$CuY(g)$ metastable line, where Y is the reducing gas element, when etching CuX. FIGS. 5, 6, and 8, show such metastable lines for Cu, with X being Cl, from temperatures ranging from 50° C. to 200° C. These can be extrapolated to other temperatures, for other halides, and/or other reducing gases. The subject invention can be used to, for example, etch partial into a layer of Cu, through a layer of Cu, or to smooth a Cu surface.

The subject invention extends the use of volatility diagrams for the purpose of understanding dry etching mechanisms commonly employed in the semiconductor industry. Volatility diagrams for the Cu—Cl system are constructed at various temperatures ranging from 50–200° C. A careful analysis of these diagrams can provide a solution to the problem of low temperature etching of copper.

In the volatility diagram for the Cu—Cl system, the partial pressures of the Cu based gaseous species are plotted as a function of the chlorine partial pressure at various temperatures. For any given Cu gas species (e.g., $CuCl(g)$), this functional relation, which is a line, can be determined from the thermodynamic equilibrium between the relevant Cu solid species (e.g., $CuCl(c)$) and the Cu gas species. Reactions involving only gases can be ignored.

The thermodynamic database for this system can be primarily obtained from the HSC Chemistry [29] database, which in turn is obtained from a number of sources including the JANAF tables [28], the Knacke [34] and Barin tables [35], the tables available in the book by Kubaschewski and Spencer [36], or from other individual articles in the open literature. As an alternative to using the tabulated data available in the JANAF tables, data sources such as HSC Chemistry, that contain functions for the specific heat capacity ($C_p$) along with the standard enthalpies and entropies of formation, can be utilized. Once the thermodynamic data containing the heat capacities along with the standard enthalpies and entropies for the independent reactions is entered as an input, the calculations can be performed at any temperature quite readily using a math software such as MathCad. In addition, data from the recent edition of Kubaschewski and Spencer [36] can be utilized, for example when there may be discrepancy between the HSC data and that given in the recent edition of the JANAF tables. Minor variations in data obtained from different sources are not expected to cause dramatic alterations in the resulting volatility diagrams.

The thermodynamic data that was utilized in a specific embodiment of the subject invention is given in Table 1. In this embodiment, condensed species for the Cu—Cl system included $Cu(c)$ (reference), $CuCl(c)$ and $CuCl_2(c)$. Since temperatures less than 300° C. were considered, all the condensed species were solid. The gaseous species included $Cu(g)$, $CuCl(g)$, $CuCl_2(g)$, $Cu_3Cl_3(g)$, $Cl_2(g)(ref)$, $Cl(g)$, $H_2(g)(ref)$, $H(g)$ and $HCl(g)$. The dimeric ($Cu_2(g)$) and trimeric ($Cu_3(g)$) gaseous compounds of copper were not considered since their influences are exerted by their monomeric counterparts. $H_2(g)$ and $HCl(g)$ are included due to reasons which will become apparent later. The monatomic species such as $H(g)$ and $Cl(g)$ are included since these species are present in plasmas used in RIE and their concentrations can be independently controlled. Charged radicals which are also present in plasmas and can have important effects on the kinetics of various reactions, were however not considered at the present time although some treatments have included them in the framework of classical thermodynamics [37–39]. Other gaseous species that have very low partial pressures or those for which adequate thermodynamic information was not available, were not included.

Volatility diagrams are constructed with the log of the partial pressures of the Cu gas species as the ordinate and the log of the chlorine partial pressure as the abscissa. The list of relevant reactions for constructing a volatility diagram for the Cu—Cl system is given in Table 2. The equilibrium constant for any reaction at a specified temperature can be obtained from the thermodynamic data given in Table 1. For example, consider the reaction $$Cu + \frac{1}{2}Cl_2 = CuCl \tag{1}$$

The equilibrium constant is given by $$\Delta G(T) = -RT \ln K(T) = -2.303 RT \log K(T) \tag{2}$$

$$\Delta G(T) = \Delta H(T) - T\Delta S(T) \tag{3}$$

$$\Delta H(T) = \left(\Delta H^o_{f\,CuCl} + \int_{298.15}^T Cp_{CuCl}(T)dT\right) - \left(\Delta H^o_{f\,Cu} + \int_{298.15}^T Cp_{Cu}(T)dT\right) - \frac{1}{2}\left(\Delta H^o_{f\,Cl_2} + \int_{298.15}^T Cp_{Cl_2}(T)dT\right) \tag{4}$$

$$\Delta S(T) = \left(S^o_{CuCl} + \int_{298.15}^T \frac{Cp_{CuCl}}{T}(T)dT\right) - \left(S^o_{Cu} + \int_{298.15}^T \frac{Cp_{Cu}}{T}(T)dT\right) - \frac{1}{2}\left(S^o_{Cl_2} + \int_{298.15}^T \frac{Cp_{Cl_2}}{T}(T)dT\right) \tag{5}$$

where $\Delta G$, $\Delta H$ and $\Delta S$ are the standard Gibbs free energy, enthalpy and entropy for the reaction, T is the absolute temperature, R is the universal gas constant, and K is the equilibrium constant for the reaction. $\Delta H(T)$ and $\Delta S(T)$ are obtained respectively from the standard enthalpy of formation ($\Delta H^o$) and standard entropies ($S^o$) for the species involved in the reaction along with knowledge of the specific heat functions, $Cp(T)$. The values for log (K) in Table 2 are given at four temperatures: 50, 100, 150 and 200° C.

The first step in the construction of the volatility diagram is to determine the regions that contain the condensed phases. For this purpose Reactions 1 and 2, the $Cu(c)$-$CuCl(c)$ and the $CuCl(c)$-$CuCl_2(c)$ reactions respectively, are considered. The chlorine partial pressure at which $Cu(c)$ is converted into $CuCl(c)$ is obtained from log (K) for that reaction.

$$\log(K) = \log\left(\frac{a_{CuCl}}{a_{Cu}P_{Cl_2}^{\frac{1}{2}}}\right) \tag{6}$$

$$\log P_{Cl_2} = -2\log(K) \text{ where } a_{Cu}, a_{CuCl} = 1$$

It is assumed that the condensed species are in their standard states, hence their activities are unity. Since there are no Cu gas species involved in this reaction, it is apparent that Eq.

(6) plots as a vertical line on the volatility diagram. To the left of the vertical line, Cu(c) is the stable phase, while to the right, CuCl(c) is the stable phase. Similarly Reaction (2) delineates the CuCl(c) and the CuCl$_2$(c) phase regions. The combination of Reactions (1) and (2) give the stable condensed phases at the specified temperature under equilibrium conditions, see FIG. 1a. This information can also be obtained from a conventional Richardson-Ellingham Diagram for chlorides.

Reactions (3)–(5) involve the vaporization of Cu(g) from the condensed species in this system, Cu(c), CuCl(c) and CuCl$_2$(c). Reaction (3), that describes the vaporization of Cu(c) to Cu(g) is independent of the partial pressure of chlorine and hence plots as a horizontal line in FIG. 1(a) at a temperature of 50° C. The equation of this line can be obtained from the equilibrium constant as shown.

$$\log(K_3) = \log\left(\frac{P_{Cu(g)}}{a_{Cu(c)}}\right) \quad (7)$$

$$\log P_{Cu(g)} = \log(K_3) \text{ where } a_{Cu(c)} = 1$$

The intersection of this line with the vertical boundary between Cu(c) and CuCl(c) results in a triple point A. Reaction (4) plots as the sloping line (AE) with a slope of –½ and expresses the reduction of CuCl(c) to Cu(g) and Cl$_2$(g). The equation of this line is obtained similar to Eq. (7).

$$\log(K_4) = \log\left(\frac{P_{Cu(g)} P_{Cl_2(g)}^{\frac{1}{2}}}{a_{CuCl(c)}}\right) \quad (8)$$

$$\log P_{Cu(g)} = \log(K_4) - \frac{1}{2}\log P_{Cl_2(g)} \text{ where } a_{CuCl(c)} = 1$$

Similar to Reaction (4), Reaction (5) plots as the sloping line connecting the triple point (E) and has a slope of one.

Figure 1B:
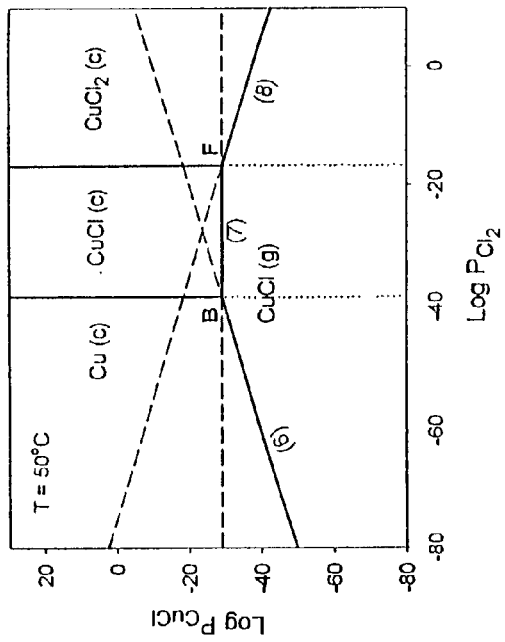
FIG. 1 is a volatility diagram for the Cu—Cl system at 50° C. where the gas phase species are considered individually: (a) $Cu(g)$, (b) $CuCl(g)$, (c) $CuCl_2(g)$ and (d) $Cu_3Cl_3(g)$. Partial pressures for all figures are given in atm (1 atm=1.013×10$^5$ Pa=760 torr). The reaction numbers for the vapor pressure lines are also indicated (see Table 2).
Figure 1D:
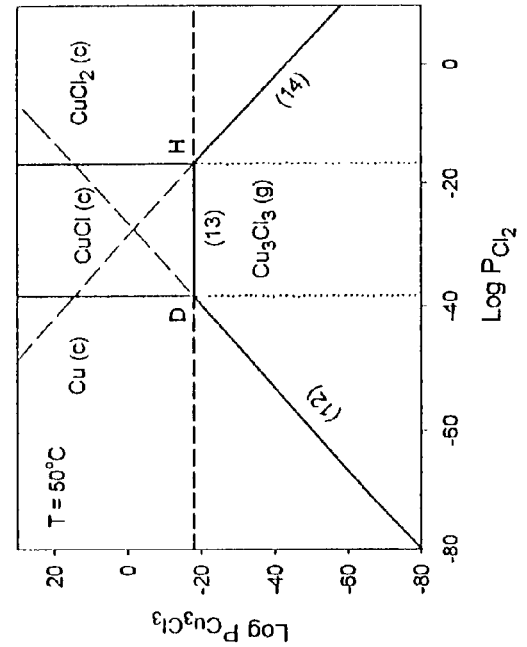
Figure 1A:
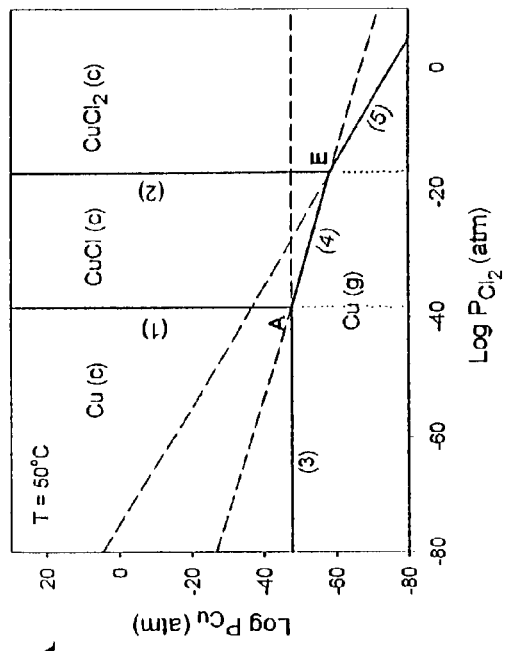

The metastable (not stable under equilibrium conditions) extensions of these lines are also indicated in the FIG. 1(a). There are two scenarios tinder which the metastable lines need to be considered. Those lines in the direction of increasing partial pressure of chlorine are usually not valid. This is because the interfacial reaction between Cu(c) and Cl$_2$(g) to give CuCl(c) is highly favorable on thermodynamic grounds even at low temperatures (see Table 2). Similarly if afresh CuCl(c) sample is exposed to the appropriate partial pressure of Cl$_2$(g), CuCl$_2$(c) is expected to form readily on the surface. However at lower chlorine pressures (<10$^{-20}$ atm at 50° C. or <10$^{-10}$ atm at 200° C.), the formation of CuCl(c) over copper is affected by the phenomenon of active oxidation, due to which the formation of CuCl(c) may be delayed until higher chlorine partial pressures are used. In such a situation, the equilibrium vapor pressure of the dominant gaseous species over copper, as given by the vapor pressure line on the volatility diagram, is not achieved due to active oxidation. The phenomenon of active oxidation is considered in greater detail in a later section.

According to Sesselmann and Chuang [15], when a bare copper surface was exposed to chlorine, the formation of CuCl(c) occurred instantaneously, but the formation of CuCl$_2$(c) was only detected after an initial transitory period. This does not necessarily imply that the CuCl$_2$(c) layer does not exist for shorter times, but rather that its thickness is too small to be detected, an observation corroborated by Lee et al. [20]. Another possibility is that the thin CuCl$_2$(c) layer that forms on the surface for very small exposure times is rapidly converted to CuCl during the interval between the chlorine exposure and the subsequent composition analysis. For longer exposure times, both the layers are of sufficient thickness to be detectable. The differences in the thickness of the CuCl(c) and CuCl$_2$(c) layers may be attributed to the large variations in the intrinsic diffusion coefficients of copper and chlorine in the solid phases as well as the boundary conditions, notably the chlorine partial pressure and the thickness of the initial copper film. A more detailed analysis of the diffusional growth of the CuCl(c) and CuCl$_2$(c) layers over copper would be useful, since the study by Sesselmann and Chuang [15] was primarily limited to the growth of the CuCl(c) layer.

In contrast, the metastable extensions of the vapor pressure lines in the direction of decreasing partial pressure of chlorine may be valid in a flowing environment, since the reduction of CuCl$_2$(c) to CuCl(c), or CuCl(c) to Cu(c), depends on the diffusion of chlorine through the thickness of the solid layers, a process which requires time. It is expected that the diffusion coefficient of chlorine in copper chlorides is perhaps several orders of magnitude lower than that of copper [15, 51]. In a system where the gas species over the Cu solid species are rapidly swept away (using a high-powered vacuum pump), equilibrium conditions are unlikely to exist at the solid-vapor interface and hence the conversion of CuCl$_2$(c) to CuCl(c) is expected to be much slower as compared to the vaporization reactions. In essence, although thermodynamically metastable, the vapor pressure lines may be kinetically stable under reducing conditions (in the direction of decreasing $P_{Cl_2}$) in a flowing environment. The subject invention can utilize these metastable lines for low temperature etching of copper.

For the purpose of etching, the weight loss due to the loss of the volatile Cu species should be appreciable. Normally weight loss in a TGA (thermogravimetric analyzer) can be registered provided the vapor pressure of the evaporating species is higher than 10$^{-8}$ atm (approx. 10$^{-3}$ Pa or 10$^{-5}$ torr) [43]. It is seen from FIG. 1(a), that the partial pressure of the Cu(g) species under equilibrium conditions, is less than 10$^{-5}$ atm. at 50° C. Hence, etching due to loss of Cu(g) is not significant at this temperature. However, examination of the metastable extensions (dotted) of the lines given by Reactions (4) and (5), i.e., the CuCl(c)-Cu(g) and the CuCl$_2$(c)-Cu(g) reactions respectively, indicate the possibility of much higher vapor pressures of Cu(g).

Reactions (6)–(8) involve the CuCl(g) species. The construction is illustrated in FIG. 1(b). It is observed that the maximum partial pressure of CuCl(g) is over the CuCl(c) phase, but this is still very low (approx. 10$^{-30}$ atm.). However the metastable extension of the CuCl(g)-CuCl$_2$(c) line (Reaction (8)) in the direction of decreasing chlorine, exhibits substantial vapor pressures.

Figure 1C:
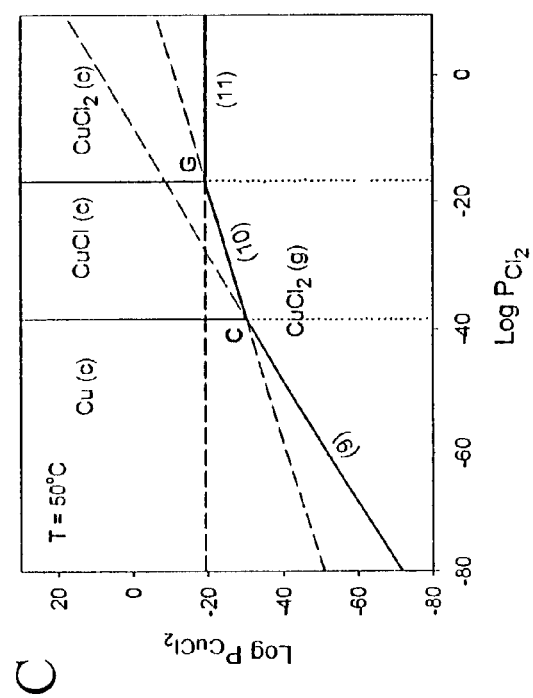

Solid-gas reactions with CuCl$_2$(g) as the volatile species are given by Reactions (9)–(11), see FIG. 1(c). The maximum vapor pressure of CuCl$_2$(g) that can be achieved is over the solid CuCl$_2$(c) phase (10$^{-20}$ atm.), but this is still too low for etching purposes at the temperature considered. The metastable extension for the CuCl(c)-CuCl$_2$(g) line (Reaction 10) has a positive slope and hence moves towards lower partial pressures of CuCl$_2$(g) with decreasing chlorine partial pressures. Metastable extensions of vapor pressure lines, such as the one above, having positive slopes are not useful for the purpose of increasing vapor pressures. The $CuCl_2$ (c)-$CuCl_2$(g) line (Reaction 11) is horizontal since there is no chlorine involved in the reaction.

Vapor pressure lines having the trimer $Cu_3Cl_3$(g) are indicated by Reactions (12)–(14) and are shown in FIG. 1(d). The CuCl(c)-$Cu_3Cl_3$(g) line (Reaction 13) has the highest vapor pressure but is again too low at 50° C. The metastable extension of the $CuCl_2$(c)-$Cu_3Cl_3$(g) line (Reaction (14)) has the highest negative slope among all the important metastable lines for the entire system (FIGS. 1(a)–(d)) and hence its vapor pressure increases the most rapidly with decreasing chlorine partial pressures. This is more easily seen in FIG. 2, where all the vapor pressure lines are superimposed on the same graph.

Figure 2:
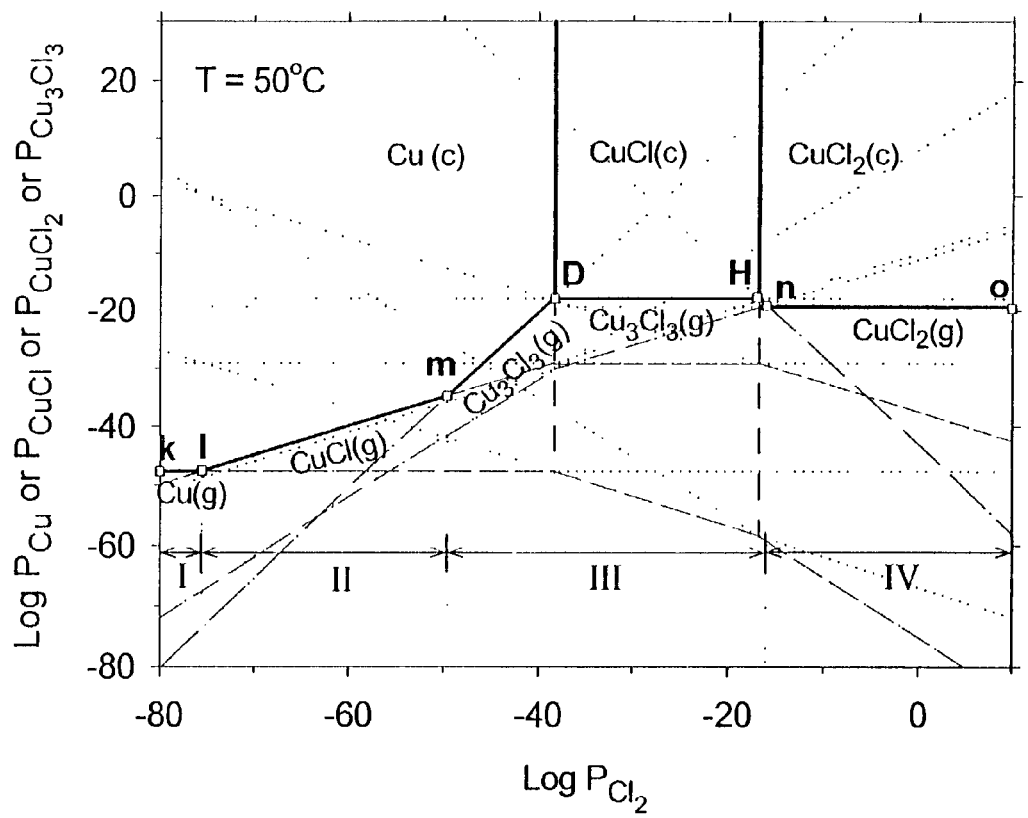
FIG. 2 is a complete volatility diagram for the Cu—Cl systems at 50° C. Pressures are given in atm. The maximum equilibrium vapor pressure line segments are solid, the stable portions of the equilibrium vapor pressure lines that are less than the maximum are dashed, and the metastable extensions are dotted. The two vertical lines separate the $Cu(c)$, $CuCl(c)$ and the $CuCl_2(c)$ condensed phase regions. The dominant gas species are: Region I—$Cu(g)$, Region II—$CuCl(g)$, Region III—$Cu_3Cl_3(g)$, and Region IV—$CuCl_2(g)$. The vapor pressure of $Cu_3Cl_3(g)$ over $CuCl(c)$ (approx. $10^{-18}$ atm) is the maximum attainable in this system (DH), however since it is significantly less than $10^{-8}$ atm, dry etching of copper under equilibrium conditions is not possible at this temperature.

The complete volatility diagram for the Cu—Cl system at 50° C. is shown in FIG. 2. This is a superposition of FIGS. 1(a)–(d), with the dominant vapor pressure lines in solid. The dashed vapor pressure lines represent vapor species having vapor pressures smaller than the maximum equilibrium vapor pressure lines, while the dotted lines represent the metastable extensions of the vapor pressure lines. The volatility diagram is divided into four regions, labeled I–IV. In region I represented by the segment kl, Cu(g) is the dominant species over Cu(c). This changes to CuCl(g) in region II (lm). In region III, $Cu_3Cl_3$(g) has the maximum vapor pressure and is represented by the segments mDHn, even though the condensed phase changes from Cu(c) (mD) to CuCl(c) (DH) to $CuCl_2$(c) (Hn). In the last region IV that persists up to atmospheric pressure, $CuCl_2$(g) has the maximum vapor pressure.

Figure 3:
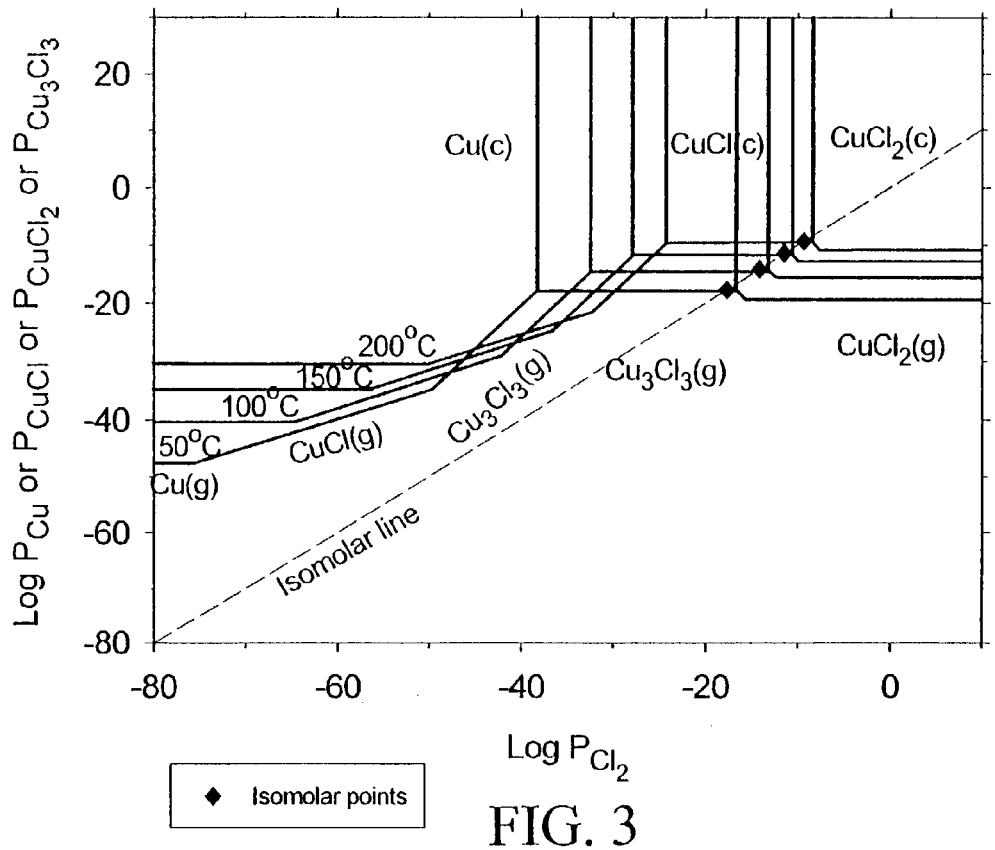
FIG. 3 is a master volatility diagram for the Cu—Cl system from 50 to 200° C. The vapor pressures of all the gas species indicated in the figure (in atm), increase with temperature and at temperatures greater than 200° C., the vapor pressure of $Cu_3Cl_3(g)$ is sufficiently high ($10^{-8}$ atm) to be effective for dry etching of copper. The isomolar line for the reaction involving the active oxidation of Cu, i.e., $3Cu(c)+\frac{3}{2}Cl_2(g)=Cu_3Cl_3(g)$, is given by the mass balance relation $P_{Cu_3Cl_3(g)}=\frac{2}{3}P_{Cl_2(g)}$, and is indicated in the figure. At the isomolar point, the vapor pressure of $Cu_3Cl_3(g)$ as given by the mass balance relation, is equal to the equilibrium vapor pressure for the reaction $3CuCl(c)=Cu_3Cl_3(g)$, a the specific temperature. Note that the conversion of copper to copper chlorides at lower temperatures (50° C.) occurs at lower partial pressures of chlorine as compared to higher temperatures (200° C.).

Volatility diagrams at 50, 100, 150 and 200° C. are combined into a master volatility diagram in FIG. 3. Only the maximum vapor pressure lines are shown in solid. It is apparent that the CuCl(c)-$Cu_3Cl_3$(g) vapor pressure line (DH in FIG. 2) is the dominant one among all the vapor pressure lines in the temperature range considered. The $CuCl_2$(c)-$Cu_3Cl_3$(g) (Hn in FIG. 2) and the $CuCl_2$(c)-$CuCl_2$(g) (no in FIG. 2) vapor pressure lines appear to be not very far behind. Clearly the vapor pressure of $Cu_3Cl_3$(g) is not sufficiently high for efficient etching for temperatures less than 200° C., since the vapor pressure is less than $10^{-8}$ atm (FIG. 3). At approximately 200° C., the $Cu_3Cl_3$(g) vapor pressure approaches $10^{-8}$ atm. For temperatures greater than 200° C., the $Cu_3Cl_3$(g) vapor pressure over CuCl(c) is greater than $10^{-8}$ atm. and hence the etching process is rapid. However, if the chlorine pressure is increased to a point where $CuCl_2$(c) is the stable phase, the vapor pressure of $Cu_3Cl_3$(g) drops till $CuCl_2$(g) becomes the dominant gas species having the maximum vapor pressure. Since the volatility diagram is a log-log plot, this apparent minor difference between the vapor pressures of $CuCl_2$(g) over $CuCl_2$(c) and $Cu_3Cl_3$(g) over CuCl(c), is about one-half to one order of magnitude. This can be significant enough in causing a reduction in the etching process, hence careful control of the chlorine partial pressure can be important.

From the volatility diagram at 200° C. (FIG. 3), one would expect that at a chlorine partial pressure of approximately $10^{-20}$ atm, CuCl(c) would form over the Cu(c) surface and the resultant $Cu_3Cl_3$(g) vapor pressure over CuCl(c) would be close to $10^{-8}$ atm. However, the formation of CuCl(c) over Cu(c) may not occur due to the phenomenon of active oxidation [39, 43–44]. This occurs because the equilibrium vapor pressure of $Cu_3Cl_3$(g), that is required for the formation of CuCl(c), is not reached. To discuss the active oxidation of Cu(c), an argument similar to that employed by Lou, Mitchell and Heuer [43] can be employed. First consider the relevant reactions $3Cu(c) + 3/2 Cl_2(g) = Cu_3Cl_3(g)$ (9)

$3CuCl(c) = Cu_3Cl_3(g)$ (10)

$Cu(c) + 1/2 Cl_2(g) = CuCl(c)$ (11)

For the formation of CuCl(c) from Cu(c), chlorine molecules diffuse through a stagnant layer at the gas-solid interface, react with Cu(c) and form $Cu_3Cl_3$(g) molecules, which in turn diffusion away into the surrounding atmosphere. In case of an RIE system, the stagnant layer is likely to be perturbed due to the impinging chlorine molecules (and radicals) and the $Cu_3Cl_3$(g) molecules are rapidly removed due to a convective process rather than due to a diffusion process alone. The equilibrium constant for Cu(c)-$Cu_3Cl_3$(g) reaction (Eq. 9) at 200° C. (Table 2) is approximately $10^{12}$. Hence one may assume that all the chlorine molecules that arrive at the Cu surface from the ambient, are converted into $Cu_3Cl_3$(g). If one further assumes that chlorine molecules arrive and $Cu_3Cl_3$(g) molecules depart at the same rate, then the active oxidation requires the generation of two $Cu_3Cl_3$(g) molecules for every three molecules of chlorine arriving at the copper surface. Thus at the Cu(c)-stagnant layer interface $P_{Cu_3Cl_3(g)} = 2/3 P_{Cl_2(g)}$. This condition is in essence a mass balance criterion [43] for the formation of $Cu_3Cl_3$(g) from Cu(c). For example at 200° C. for a chlorine partial pressure of $10^{-40}$ atm, the partial pressure of $Cu_3Cl_3$(g) generated is $2/3 \times 10^{-40}$ atm, which is several orders of magnitude lower than the equilibrium partial pressure of $Cu_3Cl_3$(g) as given by Eq. (10). Hence $Cu_3Cl_3$(g) will not condense to form CuCl(c). As the partial pressure of chlorine increases, so will that of $Cu_3Cl_3$(g). Only when the chlorine pressure has reached a point known as the isomolar point [43], will the partial pressure of $Cu_3Cl_3$(g) be equal to that given by the equilibrium value (approx. $10^{-9}$ atm) for the CuCl(c)-$Cu_3Cl_3$(g) reaction (Eq. 10). When this occurs, $Cu_3Cl_3$(g) will begin to condense on the copper surface to give CuCl(c) and on further increase in the chlorine pressure, $CuCl_2$ is formed. Beyond this point, the $Cu_3Cl_3$(g) vapor pressure over CuCl(c) remains constant, since the CuCl(c)-$Cu_3Cl_3$(g) vapor pressure line is horizontal. However because the chlorine pressure at the isomolar point is very close to the pressure required for the CuCl(c)-$CuCl_2$(c) reaction, the formation of $CuCl_2$(c) can occur with a very small increase in the chlorine pressure. When this happens, the vapor pressure of $Cu_3Cl_3$(g) over $CuCl_2$(c) drops and $CuCl_2$(g) becomes the dominant vapor phase species (FIG. 3). Because the $CuCl_2$(g) pressure is about one half to one order of magnitude lower than the $Cu_3Cl_3$(g) pressure at the isomolar point, the etching process can slow down. Another factor that may have an influence in the slowing down of the etching process, once CuCl(c) or $CuCl_2$(c) are formed, is the observation that the three important volatilization reactions for the copper chlorides—the CuCl(c)-$Cu_3Cl_3$(g) reaction, the $CuCl_2$(c)-$Cu_3Cl_3$(g) reaction and the $CuCl_2$(c)-$CuCl_2$(g) reaction, are all endothermic and have a positive free energy of formation (in contrast to the Cu(c)-$Cu_3Cl_3$(g) reaction which is exothermic and has a negative free energy of formation). Hence, the volatilization reactions involving the copper chlorides are not very favorable from a reaction kinetics viewpoint. Thus careful control of the chlorine partial pressure near the isomolar point is necessary to control the etching process, if indeed the Cu—$Cu_3Cl_3$(g) reaction is the desired etching reaction. Assuming that the partial pressure of $Cu_3Cl_3$(g) at the isomolar point is sufficient enough to cause etching ($10^{-8}$ atm. at 200–250° C.), the chlorine partial pressure must be controlled to a level very close to the isomolar point. The isomolar points at different temperatures fall along a straight line as shown in FIG. 3. This line is known as the isomolar line and is directly obtained from the mass balance relation $P_{Cu_3Cl_3(g)} = \frac{2}{3} P_{Cl_2(g)}$.

A similar process can occur in case of etching of aluminum. The active oxidation in this situation involves the Al(c)-AlCl$_3$(g) reaction. Once the isomolar point is reached, the aluminum chloride, AlCl$_3$(c) is formed.

It should be noted from FIG. 3, that for a fixed partial pressure of chlorine, the formation of copper chlorides is more favorable (from a thermodynamic viewpoint) at lower temperatures rather than at high temperatures, a fact well-known from Richardson-Ellingham diagrams for oxidation [38]. For example, at a chlorine partial pressure of $10^{-30}$ atm., at 50 and 100° C., CuCl(c) is the equilibrium condensed phase; however at 150 and 200° C., the conversion of Cu(c) to CuCl(c) is not thermodynamically favored and Cu(c) remains as the stable condensed phase. Similarly, at a chlorine partial pressure of $10^{-15}$ atm., the conversion of CuCl(c) to CuCl$_2$(c) only occurs at the lowest temperature of 50° C. At the higher temperatures, CuCl(c) remains as the stable phase. Hence for a given chlorine partial pressure, a reduction in temperature may be beneficial in increasing the thermodynamic driving force for the formation of the CuCl (c) and CuCl$_2$(c) layers over Cu(c).

It is also observed from the master volatility diagram (see math lab computations shown in Appendix 1) that the width of the CuCl(c) region, or the range of partial pressures of chlorine for which CuCl(c) is the stable condensed phase, reduces with increasing temperatures.

The replacement of Cl$_2$(g) with Cl(g) results in a volatility diagram, which is not very different from the diagram shown in FIG. 3. The major difference is in the slopes of the non-horizontal vapor pressure lines. Since the gaseous species with the maximum equilibrium vapor pressure is Cu$_3$Cl$_3$(g), which is in turn determined by the CuCl(c)-Cu$_3$Cl$_3$(g) equilibrium, the use of atomic chlorine should not in principle cause any change in the equilibrium vapor pressure of Cu$_3$Cl$_3$(g) (the CuCl(c)-Cu$_3$Cl$_3$(g) reaction does not involve Cl$_2$(g) or Cl(g) and hence the line is horizontal with a slope of zero). However, if during the process of creation of Cl radicals in a plasma, additional energy in the form of energetic ions, ultraviolet or infrared radiation is supplied [28–31], the vapor pressures of the gaseous species may be altered. A perceived advantage of atomic chlorine and other chlorine radicals is the enhanced kinetics for the formation of the CuCl(c) and/or CuCl$_2$(c) layers over the Cu(c) surface [27]. This would be true, if the growth of the layers is limited by the solid-gas interfacial reaction or by the dissociative adsorption of chlorine atoms (Cl$_2$(g)) at the solid-gas interface. Sesselmann and Chuang [15] report that for shorter exposure times (less than 200 s) at 25° C., the kinetics of formation of CuCl(c) was most likely to be controlled by the above mechanism, if the partial pressure of Cl$_2$(g) was less than 1 torr (approx. $10^{-3}$ atm). Grain boundary diffusion was argued to be not a major factor in the observed diffusion behavior. For higher exposure times, when the CuCl(c) layer was sufficiently thick, they observed the typical $t^{1/2}$ dependence of the diffusion length, indicating diffusion control. The formation of CuCl$_2$(c) only occurred for very long exposure times (1000 s) and chlorine pressures greater than 1 torr, in effect showing that the formation of the copper chloride layers occurs sequentially at least at 25° C. under the exposure conditions used by them. The possibility that the kinetics of formation of CuCl$_2$(c) can be improved with the utilization of Cl radicals generated in an Electron Cyclotron Resonance Plasma system at low temperatures (25° C.), has been suggested by Lee et al. [20]. This observation has important implications for the design of a low-temperature etching process, which is discussed later.

The subject invention relates to the utilization of metastable vapor pressure lines for enhanced etching of copper at low temperatures. It is evident from the volatility diagrams of the Cu—Cl system, that dry etching of copper is not possible at low temperatures under equilibrium conditions due to the low vapor pressures of the gaseous copper species. This is in contrast to aluminum, in which case the high vapor pressures of the aluminum chloride gas species in the presence of chlorine, provides efficient etching at low temperatures (a volatility diagram of the Al—Cl system would be useful for comparison). An alternate strategy for dry etching of copper at low temperatures has to be devised.

The importance of the metastable extensions of the vapor pressure lines in the direction of decreasing partial pressure of chlorine was discussed above. In a non-equilibrium environment where local solid-gas equilibrium conditions are unlikely to prevail (e.g., by using a vacuum pump, the gases over the solid are rapidly swept away), these metastable lines are expected to be kinetically stable. This occurs since the conversion of CuCl$_2$(c) to CuCl(c), or that of CuCl(c) to Cu(c), is limited by the solid state diffusion of chlorine, a process which is much slower than the enhanced evaporation of the gas species in a flowing environment. Among the collection of kinetically stable metastable lines, only those that have a negative slope are useful, since the vapor pressures of the Cu gaseous species in these metastable sections are increasing with respect to their stable sections. The most useful metastable vapor pressure line is the CuCl$_2$(c)-Cu$_3$Cl$_3$(g) line, since it not only has the highest negative slope (the vapor pressure of this line increases the most rapidly with decreasing chlorine partial pressures), but also exhibits much higher vapor pressures even in the stable portion of the vapor pressure line, see Reaction (14) in FIG. 1(d) or segment Hn in FIG. 2.

$$3CuCl_2 = Cu_3Cl_3(g) + \tfrac{3}{2}Cl_2(g) \tag{12}$$

It is evident from this reaction, that decreasing the partial pressure of chlorine, increases the partial pressure of Cu$_3$Cl$_3$ (g).

Unfortunately, there is an upper limit to which the metastable portion of the CuCl$_2$(c)-Cu$_3$Cl$_3$(g) line can be accessed (otherwise the vapor pressure of Cu$_3$Cl$_3$(g) would increase arbitrarily). This limit, which determines the maximum vapor pressure of Cu$_3$Cl$_3$(g) achievable, is due to the mass balance criterion [43]. When 3 moles of condensed CuCl$_2$ undergo vaporization, 1 mole of Cu$_3$Cl$_3$(g) and 1.5 moles of Cl$_2$(g) are produced. Assuming ideal gas behavior and equal diffusivity of all gaseous species, the mass balance criterion requires that $$P_{Cl_2(g)} = \frac{3}{2} P_{Cu_3Cl_3(g)} \text{ or } \log P_{Cl_2(g)} = \log P_{Cu_3Cl_3(g)} + \log \frac{3}{2} \tag{13}$$

This results in a line known as the isomolar line that always has a slope of 1. Intersection of this line with the equilibrium CuCl$_2$(c)-Cu$_3$Cl$_3$(g) line results in a point where both the mass balance criterion as well as the thermodynamic equilibrium specified by Eq. (12) are satisfied. This isomolar point may be easily obtained by substitution of the mass balance criterion (Eq. 13) into the relation for the equilibrium constant as shown in Appendix 1. The mass balance criterion used in the determination of the isomolar point for the CuCl$_2$(c)-Cu$_3$Cl$_3$(g) reaction, is in fact the same one used for the active oxidation of copper, which was discussed earlier. The difference is that in the present case, the isomolar point falls on the $CuCl_2(c)$-$Cu_3Cl_3(g)$ vapor pressure line, while in the previous case it falls on the $CuCl(c)$-$Cu_3Cl_3(g)$ vapor pressure line (compare FIGS. 3 and 4).

Figure 4:
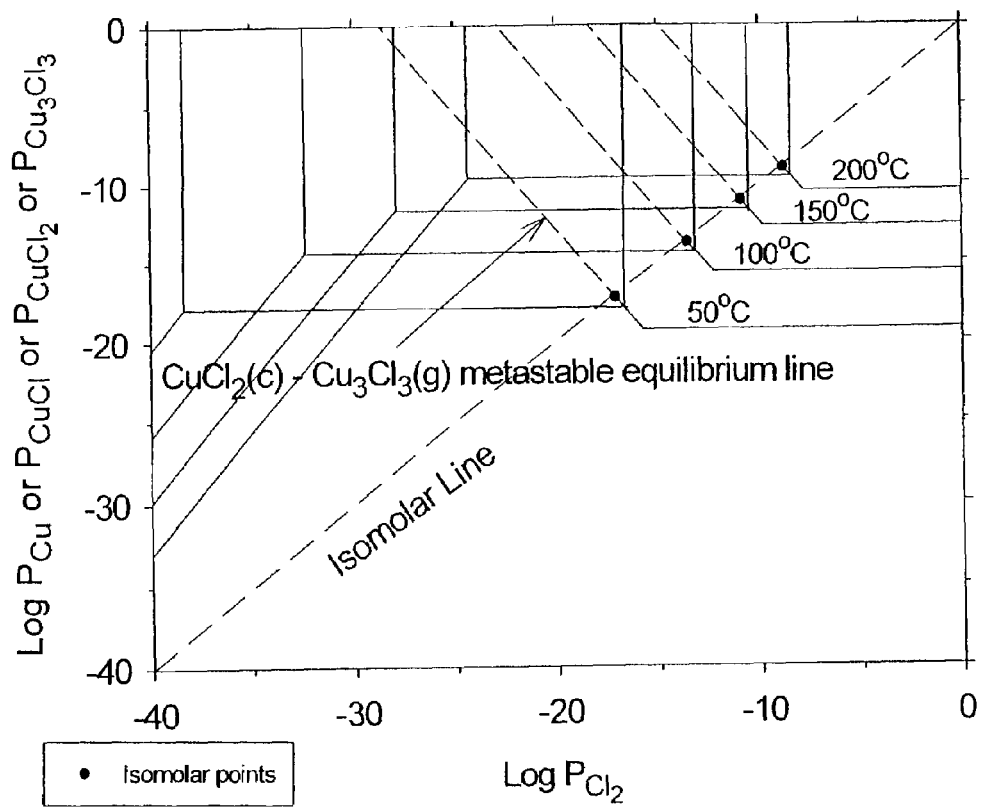
FIG. 4 is an isomolar line obtained by connecting the isomolar points (filled circle) for the reaction $3CuCl_2(c)=Cu_3Cl_3(g)+\frac{3}{2}Cl_2(g)$, on the volatility diagram. At the isomolar point, both the mass balance criterion ($P_{Cu_3Cl_3(g)}=\frac{2}{3}P_{Cl_2(g)}$) and the termodynamic equilibrium governed by the above reaction, are satisfied at the given temperature. The isomolar line defines the maximum partial pressure of $Cu_3Cl_3(g)$ in a non-reactive environment (i.e., with $Cl_2(g)$ as the only external gas). Note that the isomolar point in FIG. 3 is relevant for the active oxidation of Cu and falls on $CuCl(c)/Cu_3Cl_3(g)$ vapor pressure line. The mass balance criterion and hence the isomolar line is however the same in both cases.

In FIG. 4, the equilibrium vapor pressures at the isomolar point at 50° C. are: $P_{Cu_3Cl_3(g)}=10^{-17.1}$ and $P_{Cl_2(g)}=10^{-17.3}$ atm. Other isomolar points at different temperatures may be similarly obtained. In principle, when $CuCl_2(c)$ undergoes vaporization to $Cu_3Cl_3(g)$ and $Cl_2(g)$, the partial pressures of the gases are determined by the equilibrium constant for the dissociation reaction at the specified temperature. However in reality, the partial pressure of $Cu_3Cl_3(g)$ cannot increase indiscriminately as the partial pressure of $Cl_2(g)$ is lowered. The isomolar line defines the maximum value of the partial pressure of $Cu_3Cl_3(g)$ in a non-reactive environment that contains $Cl_2(g)$ as the only external gas in the system. It essentially limits the valid portion of the $CuCl_2(c)$-$Cu_3Cl_3(g)$ vapor pressure line. Only $Cu_3Cl_3(g)$ vapor pressures to the right of the isomolar line are attainable in practice.

It is interesting to note that the isomolar point at a given temperature falls on the metastable portion of the $CuCl_2(c)$-$Cu_3Cl_3(g)$ vapor pressure line, unlike the examples discussed by Lou, Mitchell and Heuer [43]. In any case, it is seen from FIG. 4, that the maximum partial pressure of $Cu_3Cl_3(g)$ over $CuCl_2(c)$, which is represented by the isomolar point, is too low to be useful for the purpose of dry etching of copper at low temperatures and is in fact hardly different from the equilibrium vapor pressure of $Cu_3Cl_3(g)$ over $CuCl(c)$. Thus, in a non-reactive environment, the useful part of the metastable extension of the $CuCl_2(c)$-$Cu_3Cl_3(g)$ vapor pressure line cannot be accessed.

The isomolar point at a given temperature for the $CuCl_2(c)$-$Cu_3Cl_3(g)$ dissociation reaction (Eq. 9), is no longer applicable in presence of a reactive gas such as hydrogen. The relevant reaction that has to be considered in this case is $$3CuCl_2 + \tfrac{3}{2}H_2(g) = Cu_3Cl_3(g) + 3HCl(g) \quad (14)$$

The volatilization of $CuCl_2(c)$ in the presence of hydrogen creates its own environment. As in the earlier case, assuming ideal gas behavior and equal diffusivity of all gaseous species, the mass balance criterion requires that 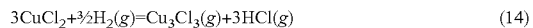 $P_{Cu_3Cl_3(g)}=\tfrac{1}{3}P_{HCl(g)}$. Substituting this relation in the equation for the equilibrium constant (Appendix 2), the partial pressure of $Cu_3Cl_3(g)$ over $CuCl_2(c)$ for a given hydrogen partial pressure at a specified temperature can be determined. This is referred by Lou, Mitchell and Heuer [43] as the isobaric point and represents the maximum pressure of $Cu_3Cl_3(g)$ that is possible under these conditions. For example, in FIG. 5, at the isobaric point, for $P_{H_2(g)}=10^{-5}$ atm and a temperature of 50° C., $P_{Cu_3Cl_3(g)}=10^{-1.4}$ atm. The isobaric points for the same partial pressure of hydrogen fall on a straight line known as the isobaric line, shown in FIG. 5 as a dotted line. It is evident from FIG. 5, that an increase in the hydrogen partial pressure and temperature results in an increase in the partial pressure of $Cu_3Cl_3(g)$ over $CuCl_2(c)$. In practice, the kinetics of the above reaction (Eq. 14) may not be sufficient enough to realize the high $Cu_3Cl_3$ vapor pressures predicted from the equilibrium calculations. It is seen from Table 3 (Reaction 7) that though the free energy change for the reaction (Eq. 14) is negative, the enthalpy change is positive indicating an endothermic process. Indeed even at very low temperatures, a very high $Cu_3Cl_3(g)$ pressure can be obtained at moderate hydrogen pressures and a significant part of the metastable $CuCl_2(c)$-$Cu_3Cl_3(g)$ vapor pressure line can be accessed. Thus the reduction of $CuCl_2(c)$ in a reactive environment such as hydrogen, is highly effective for the purpose of increasing its volatility. As a result, it is expected, that extremely high etch rates for copper at low temperatures, can be achieved.

If instead of pure hydrogen gas, monoatomic hydrogen is utilized for the reduction reaction, Eq. (14) can be modified to $$3CuCl_2 + 3H(g) = Cu_3Cl_3(g) + 3HCl(g) \quad (15)$$

Under normal circumstances, the concentration of atomic hydrogen and other charged radicals in a hydrogen atmosphere is extremely small (see discussion by Rubino [48], Gaskell [49] and Jacobs [50]). However significant amounts can be generated in the plasmas that are typically used in RIE systems, although perhaps not as large as molecular hydrogen. Attempts to determine the concentration of such species using classical thermodynamics have been discussed [48,50], however these have not been attempted at the present time. Instead, it is assumed in the calculation of the isobaric lines, that the concentration of atomic hydrogen is at least 5–10 orders of magnitude smaller than that of molecular hydrogen. For example, partial pressures in the range of $10^{-30}$ to $10^{-10}$ atm were utilized in the present calculations, as compared to a range of $10^{-20}$ to $10^0$ atm in the case of molecular hydrogen.

Using the same mass balance criterion as before, 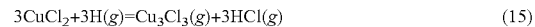 $P_{Cu_3Cl_3(g)}=\tfrac{1}{3}P_{HCl(g)}$, the isobaric lines for various atomic hydrogen partial pressures were obtained, see FIG. 6. It is seen that even with the low levels of atomic hydrogen, extremely high pressures of $Cu_3Cl_3(g)$ are generated, that are significantly larger than those achievable using molecular hydrogen alone. The interesting observation from FIG. 6 is that, for a given concentration of atomic hydrogen, the pressure of $Cu_3Cl_3(g)$ at lower temperatures is greater than that at higher temperatures. This is reflected in a reversal of slopes of the isobaric lines in FIG. 6 as compared to FIG. 5. The isobaric lines for atomic hydrogen have a negative slope and hence the partial pressure of $Cu_3Cl_3(g)$ decreases as temperature is increased. This peculiar behavior is due to the fact that the free energy of formation for the reaction given by Eq. (15) is relatively constant in the relevant temperature range, hence the magnitude of the equilibrium constant, which is related to the partial pressure of $Cu_3Cl_3(g)$, reduces with temperature (log $K=-\Delta G/RT$). The free energy of formation for this reaction (Eq. 15) varies from approximately $-627$ kJ at 50° C. to $-672$ kJ at 200° C. and it is exothermic with $\Delta H$ around $-530$ kJ in the temperature range 50–200° C. This is in contrast to the $CuCl_2(c)$-$Cu_3Cl_3(g)$ reduction reaction with molecular hydrogen (Eq. 14) which has a larger free energy of formation from $-21$ kJ at 50° C. to $-89$ kJ at 200° C. and is endothermic with $\Delta H$ around 125 kJ from 50–200° C. Compared to the $CuCl_2$—$Cu_3Cl_3(g)$ reduction reaction with molecular hydrogen (Eq. 14) that is endothermic, the reduction reaction with atomic hydrogen (Eq. 15) is highly exothermic and has a lower free energy of formation (Table 3). Thus, the kinetics of the $CuCl_2$-$Cu_3Cl_3(g)$ reduction process with atomic hydrogen or other radicals present in a hydrogen plasma is expected to be very favorable as compared to that using neutral hydrogen species alone.

It is observed from FIG. 6 at 50° C. and $P_{H(g)}=10^{-20}$ atm, $P_{Cu_3Cl_3(g)}=10^{10}$ atm, while at 100° C. for the same atomic hydrogen pressure, $P_{Cu_3Cl_3(g)}=10^{7.1}$ atm. These pressures are so large, suggesting that a more reasonable choice for the concentration of atomic hydrogen achievable is probably less than $10^{-20}$ atm, although a more detailed analysis would be desirable. In any case, it is clear that the strategy of utilizing the metastable $CuCl_2(c)$-$Cu_3Cl_3(g)$ vapor pressure line for the purpose of etching of copper, can be realized, if a reactive atmosphere based on hydrogen ($H_2$ or H) is utilized for the reduction of $CuCl_2(c)$.

It is desirable to use the $CuCl_2(c)$-$Cu_3Cl_3(g)$ reaction as the primary etching reaction, however once $CuCl_2(c)$ has been completely etched due to the formation of $Cu_3Cl_3(g)$, the underlying $CuCl(c)$ layer is exposed to the reactive environment. The $CuCl_2(c)$ layer can again be grown to the desired thickness by subjecting the exposed $CuCl(c)$ layer to chlorine for a given length of time, followed by etching using hydrogen. This process can be repeated the desired number of times to achieve the specified etch depth. Although the etching of $CuCl(c)$ is not required in the above process, nevertheless it is still of interest to examine the extent to which vaporizing reactions involving $CuCl(c)$ are useful. For this purpose, the $CuCl(c)$-$Cu(g)$ metastable vapor pressure line can be considered. The reactions of interest are $$CuCl(c)+\tfrac{1}{2}H_2(g)=Cu(g)+HCl(g) \qquad (16)$$

$$CuCl(c)+H(g)=Cu(g)+HCl(g) \qquad (17)$$

Figure 7A:
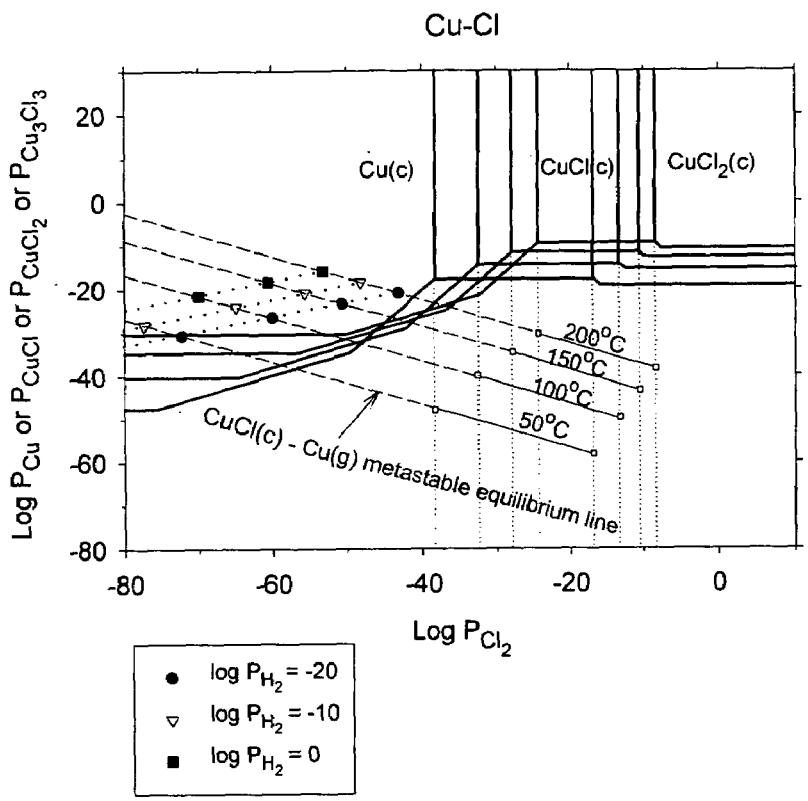
FIG. 7 shows isobaric lines for the $Cu(g)$-$CuCl(c)$ metastable equilibrium line using (a) $H_2(g)$ and (b) $H(g)$. The vapor pressures are not sufficient enough (less than $10^{-8}$ atm) to cause noticeable etching of $CuCl(c)$ at low temperatures.
Figure 7B:
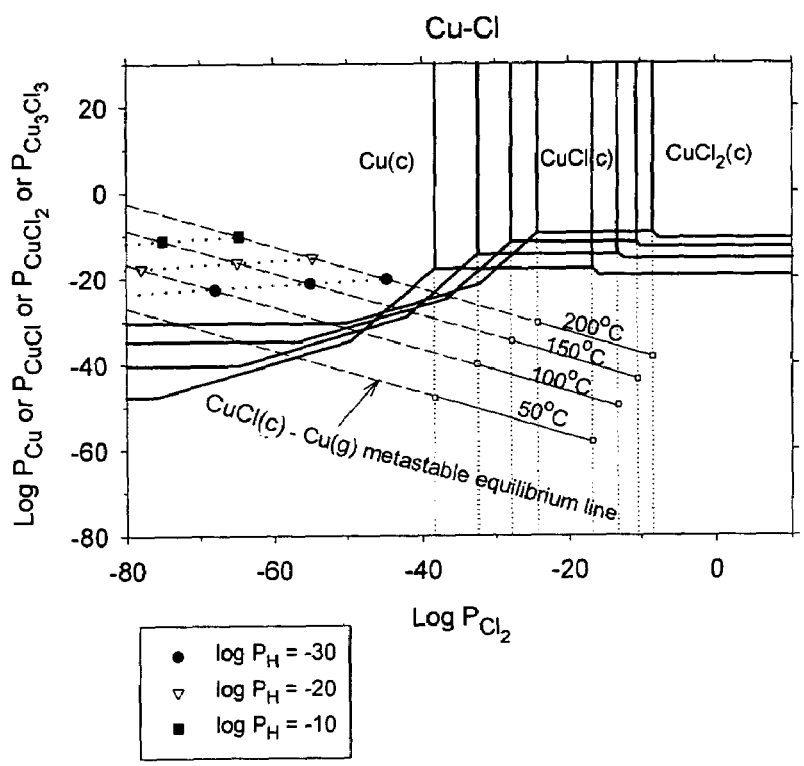

Using the mass balance criterion, $P_{Cu(g)}=P_{HCl(g)}$, and the same procedure that was earlier used for the $CuCl_2(c)$-$Cu_3Cl_3(g)$ isobaric lines, the isobaric lines for the above reactions can be obtained as shown in FIGS. 7(a) and (b). It is again observed that the $Cu(g)$ pressures obtained using $H_2(g)$ (Eq. (16)) are much smaller than those using $H(g)$ (Eq. (17)). From FIG. 7(b), it is evident that even for $H(g)$ pressures greater than $10^{-20}$ atm at 50° C., the $Cu(g)$ pressures are not greater than $10^{-8}$ atm. Thus the $CuCl(c)$-$Cu(g)$ reduction process is not very useful for the purpose of etching the final $CuCl(c)$ layer, unless higher temperatures are utilized.

In a reactive environment containing hydrogen, the formation of $CuH(g)$ as a result of the reaction between $Cu(c)$, $CuCl(c)$ and $CuCl_2(c)$, and hydrogen ($H_2$ and H) needs to be taken into account. Thermodynamic data for CuH is provided in the HSC data base [36]. Data for $CuH_2$ and other possible gaseous species in this system may be available in more recent editions of other data bases [35, 37]. The relevant reactions involving $CuH(g)$ are shown in Table 3. It is assumed that the concentrations of $H_2$ and H are not sufficient enough to form copper hydrides ($P_{H_2}<10^{30}$ atm, $P^H<10^{-18}$ atm at 50° C. [29]). The vapor pressure lines for $CuH(g)$ for various pressures of $H_2(g)$ and $H(g)$ are shown in FIGS. 8 and 9 at 50 and 200° C. respectively. The two-dimensional volatility diagrams for the Cu—Cl—H system depicted in FIGS. 8 and 9 are in fact sections (at constant $H_2$ or H) of the actual three dimensional Cu—Cl—H volatility diagram. Under equilibrium conditions, the $CuH(g)$ vapor pressures over the condensed Cu—Cl species are too low for the purpose of etching, except at high temperatures (200° C.) and extremely high atomic hydrogen concentrations. However, as in the earlier cases, there is a possibility of utilizing the metastable extensions of the vapor pressure lines. The reactions with $CuCl_2(c)$ and molecular and atomic hydrogen are $$CuCl_2(c)+\tfrac{3}{2}H_2(g)=CuH(g)+2HCl(g) \qquad (18)$$

$$CuCl_2(c)+3H(g)=CuH(g)+2HCl(g) \qquad (19)$$

Figure 8A:
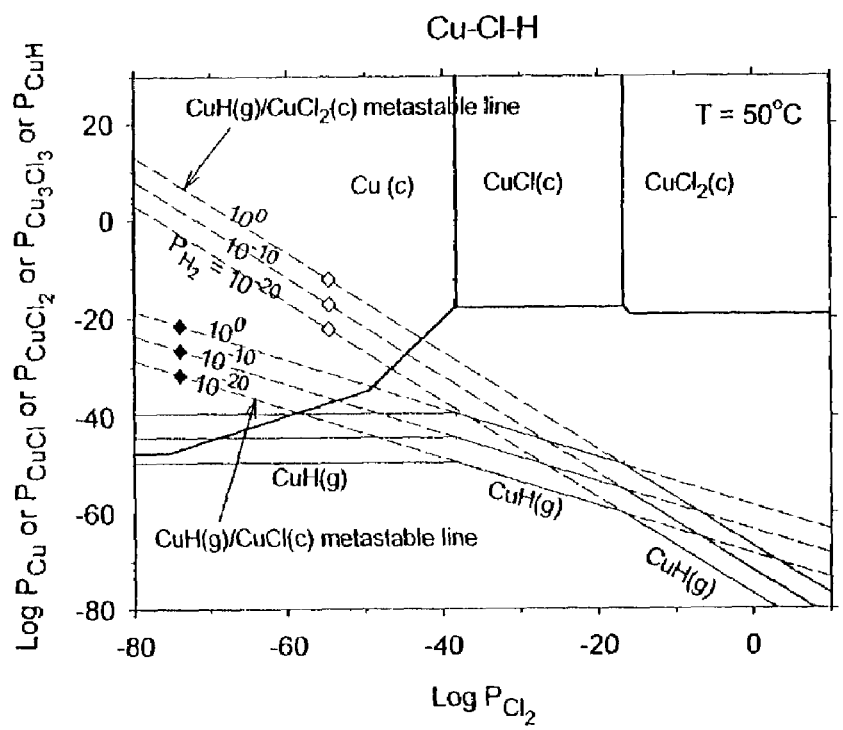
FIG. 8 is a volatility diagram for the Cu—Cl—H system at 50° C. The $CuH(g)$ vapor pressure lines for different $H_2(g)$ and $H(g)$ concentrations are shown in (a) and (b) respectively. The metastable extensions for the $CuCl(c)$-$CuH(g)$ and the $CuCl_2(c)$-$CuH(g)$ lines are also shown and the maximum vapor pressures of $CuH(g)$ that are attainable are indicated (symbols).
Figure 9A:
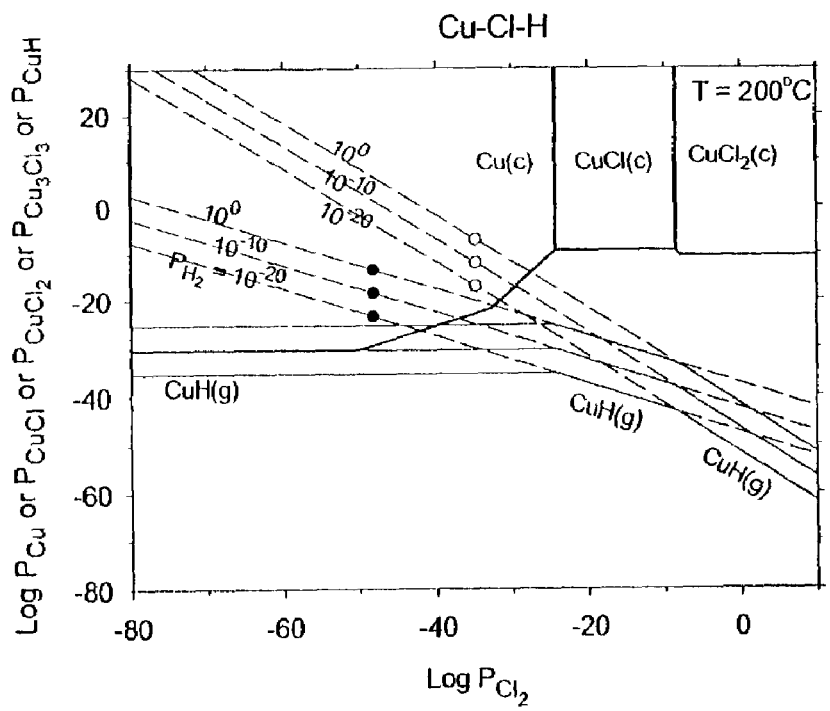
FIG. 9 is volatility diagram for the Cu—Cl—H system at 200° C. The $CuH(g)$ vapor pressure lines for different $H_2(g)$ and $H(g)$ concentrations are shown in (a) and (b) respectively.
Figure 9B:
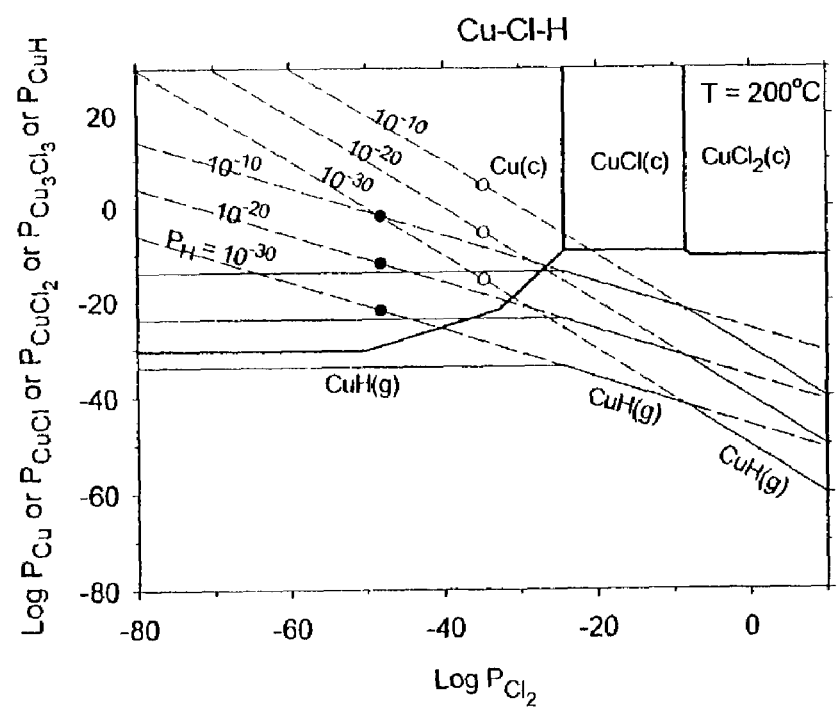

Using the mass balance criterion $P_{CuH(g)}=\tfrac{1}{2}P_{HCl(g)}$, the limiting or maximum partial pressure of $CuH(g)$ for a given $H_2$ or H pressure and temperature, can be computed and plotted on the metastable $CuCl_2(c)$-$CuH(g)$ vapor pressure line (FIGS. 8(a) and (b)). For $H_2(g)$, the $CuH(g)$ pressures over $CuCl_2(C)$ are approximately ten orders of magnitude lower than $CuCl_3(g)$ (compare FIGS. 5 with 8(a), 9(a)). Similarly if $H(g)$ is utilized, the $CuH(g)$ pressures although substantially enhanced as compared to the previous situation, are still about ten orders of magnitude lower than $Cu_3Cl_3(g)$ (compare FIGS. 6 with 8(b), 9(b)). Hence, although $CuH(g)$ can be detected using a mass spectrometer during etching of $CuCl_2(c)$ using either $H_2(g)$ or $H(g)$, its concentration is expected to be much lower than that of $Cu_3Cl_3(g)$.

Once $CuCl_2(c)$ has been completely etched due to the formation of $Cu_3Cl_3(g)$, the underlying $CuCl(c)$ layer is exposed to the reactive environment. Although it is not desirable to utilize the $CuCl(c)$-$CuH(g)$ reaction for the purpose of etching, it is still desirable to examine the reaction. If it is desired to etch CuCl using the CuCl–$CuH(g)$ vapor pressure line, the reaction with $H_2(g)$ is $$CuCl(c)+H_2(g)=CuH(g)+HCl(g) \qquad (20)$$

and with $H(g)$, it is $$CuCl(c)+2H(g)=CuH(g)+HCl(g) \qquad (21)$$

Figure 8B:
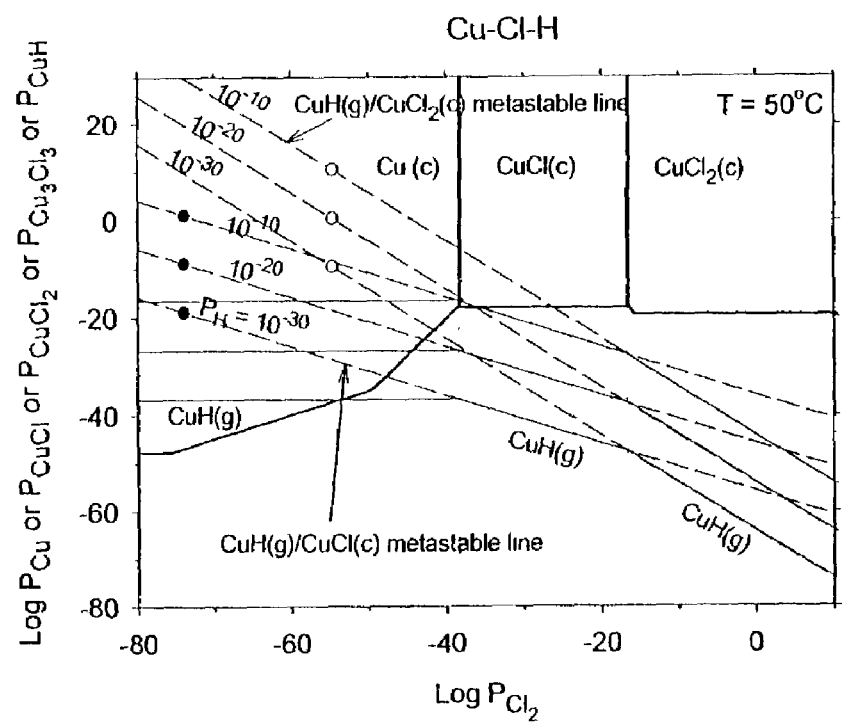

Using a mass balance criterion as before, the concentrations of $CuH(g)$ using $H_2(g)$ and $H(g)$ at various temperatures can be computed and are shown in FIGS. 8 and 9. From FIG. 8(b), it is seen that $CuH(g)$ pressures greater than $10^{-8}$ atm can be obtained at 50° C., if the atomic hydrogen concentrations are greater than $10^{-20}$ atm. The metastable $CuCl(c)$-$CuH(g)$ or the $CuCl_2(c)$-$CuH(g)$ vapor lines may also be utilized for the purpose of etching. However the metastable $CuCl_2(c)$-$Cu_3Cl_3(g)$ vapor line is the one to be preferred, since significantly higher $Cu_3Cl_3(g)$ pressures can be obtained and this is expected to result in superior etching kinetics. It should also be noted that the primary etching reaction, Eq. 15, is much more exothermic as compared to the reactions, Eqs. (18–21), involving $CuH(g)$, (see Reactions 9–12 in Table 3) and hence one may expect the concentration of $Cu_3Cl_3(g)$ to be significantly higher than $CuH(g)$ even from a kinetic basis.

The subject etching mechanism can also be effectively utilized using other halides, e.g., bromine, iodine or fluorine [53]. The resultant volatility diagrams are similar to the Cu—Cl system. It is assumed during the present analysis that the $CuCl(c)$ and $CuCl_2(c)$ compounds have no deviations from stoichiometry. This assumption is commonly employed in the development of predominance and volatility diagrams. In reality, deviations from stoichiometry are common and as a result the activities of the copper chlorides may deviate from unity. The designations for these compounds should be $CuCl_{1+x}$ and $CuCl_{2+y}$ (or $CuCl_{1-x}$ and $CuCl_{2-y}$ depending on the defect chemistry), where x and y are small values that may be positive or negative and depend upon the chlorine partial pressure and temperature. For example, x may range from (−0.2) to (+0.4) and y from (−0.3) to (+0.1). In spite of not taking into account variations in stoichiometry, significant deviations from the current analysis are not expected.

In order to perform a detailed analysis of the entire etching sequence for copper, the time required for the diffusional growth of the $CuCl(c)$ and $CuCl_2(c)$ layers for the purpose of utilizing the primary $CuCl_2(c)$-$Cu_3Cl_3(g)$ volatilization reaction needs to be considered, and in fact may be the rate-limiting step.

Figure 10:
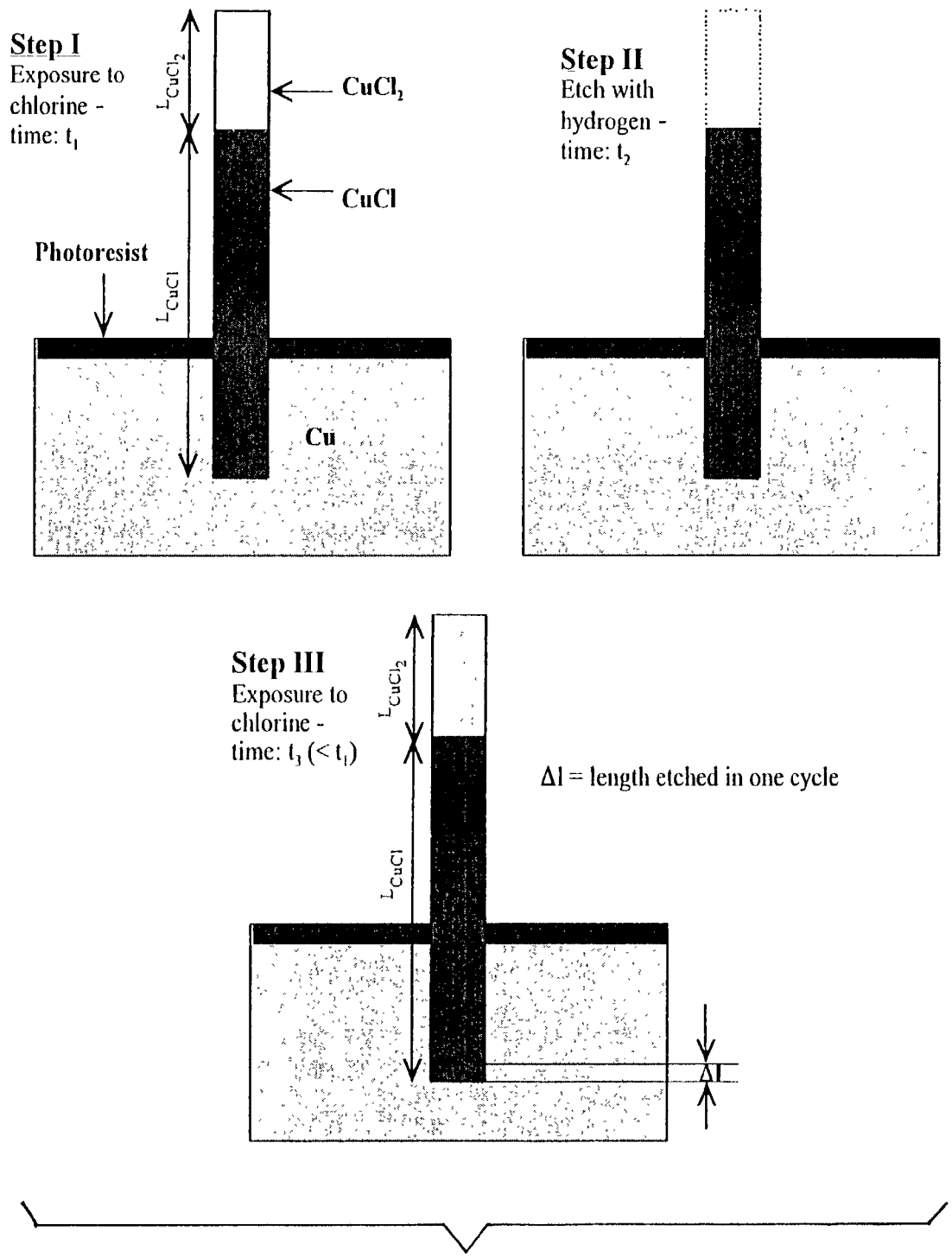
FIG. 10 is a multi-step dry etching process for copper. In Step I, a RIE system containing chlorine is used to convert Cu to CuCl and $CuCl_2$. In Step II, only the $CuCl_2$ is again formed by using chlorine. Steps II and III are then repeated a number of times to obtain the desired etch depth.

A specific low-temperature, dry etching process for copper in accordance with the subject invention is aimed at utilizing the metastable $CuCl_2(c)$-$Cu_3Cl_3(g)$ volatilization reaction in the presence of hydrogen ($H_2$ or H radicals). This process can incorporate two major steps (FIG. 10). The initial step is the diffusion step, that involves the formation of $CuCl_2(c)$ along with $CuCl(c)$ by exposing the copper surface to chlorine ($Cl_2$ or Cl radicals) in the plasma system. This exposure can occur at temperatures lower than or equal to about 25° C. In the next step, the $CuCl_2(c)$ layer is etched in a hydrogen containing plasma. These steps can be repeated many times over till the desired etch depth is achieved. It is expected that the rate-limiting step is the growth of the $CuCl_2(c)$ layer, since extremely high etch rates can be achieved using the $CuCl_2(c)$-$Cu_3Cl_3(g)$ volatilization reaction in the presence of hydrogen (FIGS. 5 and 6). As an example consider the etching of copper at 250° C. by using the horizontal $CuCl(c)$-$Cu_3Cl_3(g)$ equilibrium vapor pressure line, for which $Cu_3Cl_3(g)$ has the maximum equilibrium vapor pressure between approximately $10^{-7}$ and $10^{-8}$ atm. Using Langmùir's model, the molar vaporization rate for Cu can be estimated as follows [36]:

$$N_{Cu}\ (\text{mols/cm}^2\text{-s}) = 44.33 \left( 3 A_{Cu_3Cl_3} \frac{P_{Cu_3Cl_3}}{\sqrt{MW_{Cu_3Cl_3} T}} \right) \quad (22)$$

where $N_{Cu}$ is the vaporization rate of copper in mols/cm²-s; $A_{Cu_3Cl_3}$ is the evaporation coefficient that is between 0 and 1; $P_{Cu_3Cl_3}$ is the partial pressure of $Cu_3Cl_3(g)$ in atm; T is the absolute temperature in K; and $MW_{Cu_3Cl_3}$ is the molecular weight of $Cu_3Cl_3(g)$ in g/mol. The factor of 3 appears before the evaporation coefficient, $A_{Cu_3Cl_3}$, because there are 3 moles of copper evaporated for every mole of $Cu_3Cl_3(g)$. To convert to a recession or etching rate, multiply $N_{Cu}$ by the molar volume of copper (7.09 cc/mol).

$$\frac{dl}{dt}\ (\text{nm/min}) = N_{Cu}(\text{mols/cm}^2\text{-s}) \cdot V_{Cu}(\text{cc/mol}) \cdot 10^7 (\text{nm/cm}) 60(\text{s/min})$$

where $$\frac{dl}{dt}$$

is the etch rate for Cu in nm/min. The evaporation coefficient in a vacuum at high temperatures is approximately equal to 1. Although the temperatures utilized here are much lower, high vacuum conditions can be maintained in the system using a high-powered vacuum pump and hence the same approximation is used. The computed etch rates at 250° C. are:

$$P_{Cu_3Cl_3} = 10^{-8} \text{atm}, \frac{dl}{dt} = 14.4\ \text{nm/min, and}$$

$$P_{Cu_3Cl_3} = 10^{-7} \text{atm}, \frac{dl}{dt} = 144\ \text{nm/min.}$$

The higher value is within the range of the experimentally determined etch rates by Miyazaki et al. [14]. The computed etch rates using Langmùir's model are due to the process of chemical etching. During the actual RIE process, the rates are usually higher, because there are additional contributions due to the ion bombardment process that are affected by the plasma operating parameters (e.g., substrate bias, RF power, flow rate). In the present situation by using the $CuCl_2(c)$-$Cu_3Cl_3(g)$ volatilization reaction in the presence of hydrogen, chemical etching alone is sufficient to achieve high etch rates since the vapor pressures are extremely high (>>$10^{-6}$ atm) as evident from FIGS. 5 and 6. Because there is a direct relation between the partial pressure of $Cu_3Cl_3(g)$ and the etch rate (Eq. 22), increasing the partial pressure of $Cu_3Cl_3(g)$ a few orders of magnitude by using the hydrogen-induced $CuCl_2(c)$-$Cu_3Cl_3(g)$ vaporization process, results in extraordinarily high etch rates at very low temperatures (25° C.). However as mentioned earlier, the resultant etch rate is limited by the reaction diffusion process required for the growth of the $CuCl_2(c)$ layer. Thus, the etching process is preferably designed so as to minimize the time involved in this step. The anisotropic nature of the RIE process for the purpose of etching is desirable, but the anisotropic growth of the $CuCl(c)$ and $CuCl_2(c)$ layers is perhaps more important for the present etch process. These issues are discussed in greater detail.

Step I:

In Step I the copper surface at a given temperature (e.g., 25° C.) is exposed to a chlorine plasma for a given length of time $t_1$. For shorter times, one may expect the growth of the CuCl and $CuCl_2$ layers to be a linear function of the exposure time. For longer exposure times, the growth rates may become parabolic indicating bulk diffusion control and hence shorter times may be preferable. Linear growth kinetics usually indicates enhanced growth due to contributions from grain boundary diffusion, due to which the interfacial reaction time becomes a limiting factor. In such a situation, the CuCl layer may have to achieve a certain thickness before the growth of the $CuCl_2$ layer is visually detected. Depending on the magnitude of the diffusion coefficients of copper and chlorine, that are temperature dependent, and the partial pressure of chlorine, the CuCl and $CuCl_2$ layers grow to lengths $L_{CuCl}$ and $L_{CuCl_2}$ respectively. Assuming that the lengths of the layers scale linearly with their interdiffusion coefficients [54], $L_{CuCl}/L_{CuCl_2} \propto D_{CuCl}/D_{CuCl_2}$ the ratios of the lengths may be, for example, 3:1 or even 5:1, depending on the ratio of the interdiffusion coefficients. Since the intrinsic diffusion (as defined by Darken [43]) of copper is several times larger than chlorine at least in CuCl [15], and assuming a similar behavior holds true in $CuCl_2$, one may expect the interdiffusion coefficient of CuCl to be much larger than $CuCl_2$. To examine this in some detail, first consider the intrinsic coefficients of Cu and Cl in CuCl and $CuCl_2$.

$$D_{Cu}^{CuCl} = R_{Cu} D_{Cu}^{CuCl_2}\ \text{and} \quad (24)$$
$$D_{Cl}^{CuCl} = R_{Cl} D_{Cl}^{CuCl_2}\ \text{and}$$
$$D_{Cl}^{CuCl} = Y D_{Cl}^{CuCl}\ \text{where}\ R_{Cu} > 1, R_{Cl} < 1\ \text{and}\ Y >> 1$$

$$\tilde{D}^{CuCl} = (X_{Cu} D_{Cl})^{CuCl} + (X_{Cl} D_{Cu})^{CuCl}\ \text{and} \quad (25)$$
$$\tilde{D}^{CuCl_2} = (X_{Cu} D_{Cl})^{CuCl_2} + (X_{Cl} D_{Cu})^{CuCl_2}$$

$R_{Cu}$ is the ratio of the intrinsic coefficients of copper and $R_{Cl}$ is the ratio of the intrinsic coefficients of chlorine in the two phases. The intrinsic diffusion coefficient of copper in CuCl is expected to be greater than that in $CuCl_2$. Similarly the intrinsic diffusion coefficient of chlorine in CuCl$_2$ is likely to be greater than that in CuCl. Hence $R_{Cu}$ is greater than one, while $R_{Cl}$ is less than one. Y is the ratio of the intrinsic coefficients of copper and chlorine in CuCl and is expected to be a large number, for example between $10^2$ and $10^3$ even higher [15]. The interdiffusion coefficients for each phase are related to the intrinsic diffusion coefficients by Darken's relation [43].

Using the relations in Eq. (24), the interdiffusion coefficients in Eq. (25) can be expressed as $$\tilde{D}_{CuCl} = D_{Cu}^{CuCl}\left(\frac{X_{Cu}^{CuCl}}{Y} + X_{Cl}^{CuCl}\right) \text{ and} \quad (26)$$

$$\tilde{D}_{CuCl_2} = D_{Cu}^{CuCl}\left(\frac{X_{Cu}^{CuCl_2}}{Y \cdot R_{Cl}} + \frac{X_{Cl}^{CuCl_2}}{R_{Cu}}\right)$$

Hence the ratio of the interdiffusion coefficients is $$\frac{\tilde{D}_{CuCl}}{\tilde{D}_{CuCl_2}} = \frac{\frac{X_{Cu}^{CuCl}}{Y} + X_{Cl}^{CuCl}}{\frac{X_{Cu}^{CuCl_2}}{Y \cdot R_{Cl}} + \frac{X_{Cl}^{CuCl_2}}{R_{Cu}}} \quad (27)$$

Table 4 explores the variations in this ratio for various choices of $R_{Cu}$, $R_{Cl}$ and Y. It is assumed that both CuCl and CuCl$_2$ are stoichiometric compounds, hence $$X_{Cu}^{CuCl} = X_{Cl}^{CuCl} = 1/2 \text{ and } X_{Cu}^{CuCl_2} = 1/3, X_{Cl}^{CuCl_2} = 2/3 \quad (28)$$

Reasonable choices are made for the variables, $R_{Cu}$, $R_{Cl}$ and Y. The actual value of Y may well be greater than $10^2$, in which case the ratio of the diffusion coefficients and hence the ratio of the thicknesses will be higher than those indicated in Table 4. From Table 4 it is observed that the ratio of the interdiffusion coefficients of CuCl and CuCl$_2$, and hence the ratio of the lengths of the two layers, can be made smaller if: (1) $R_{Cu}$ is decreased, (2) $R_{Cl}$ is decreased, and (3) Y is decreased. Thus to promote the growth of the CuCl$_2$ layer in relation to the CuCl layer, the intrinsic diffusion coefficients of Cu and Cl in CuCl$_2$ have to be increased with respect to those in CuCl. Note that this does not necessarily mean that the individual growth rate of the CuCl$_2$ phase also increases, since the diffusion coefficients are expected to decrease with temperature but not in the same proportion.

One simple way the ratio can be controlled is by varying the temperature. Lowering the temperature may be beneficial in reducing the ratio of the interdiffusion coefficients, thus promoting the growth of the CuCl$_2$ layer in relation to the CuCl layer. For a specified chlorine partial pressure, changing the temperature also affects the boundary conditions, i.e., the surface chemical potential and the surface concentration of Cl. It was mentioned earlier with reference to FIG. 3, that for a given chlorine pressure, reducing the temperature has a beneficial effect in increasing the thermodynamic driving force for the formation of the CuCl$_2$. This factor is particularly important in case of a RIE system, where higher chlorine pressures to encourage the formation of CuCl$_2$ cannot be used, the pressures being limited to 20–400 mTorr (pg. 301 in ref. [9]). An increase in the concentration of Cl radicals obtained using an Electron Cyclotron Plasma (ECR) system at low temperatures, has been reported by Lee et al. [20] to be particularly useful in increasing the growth rate of the CuCl$_2$ for shorter times. Thus the effect of lowering the temperature and increasing the concentration of Cl radicals may have a synergistic effect in regard to (a) early formation of CuCl$_2$, (b) higher growth rate of CuCl$_2$ because of the higher surface chemical potential of Cl (though the diffusion coefficients are reduced) and, (c) increased thickness of the CuCl$_2$ layer due to a reduction in the ratio of $L_{CuCl}/L_{CuCl_2}$. A reduction in temperature is also preferable for obtaining anisotropic etching and smooth vertical sidewalls (pg. 22 in ref. 52) and is beneficial in preventing redeposition of the copper chlorides from the exit gas stream thus reducing equipment maintenance costs. It should be pointed out that the sputtering effect should be minimized during the growth of the copper chloride layers by utilizing high pressure plasmas with low ion energies. A low temperature may be helpful in this regard as well. In a specific embodiment, sub-zero temperatures can be utilized.

The anisotropic growth of the CuCl and CuCl$_2$ layers during Step I and the anisotropic etching during Step II (to be discussed next) are important. Sesselmann and Chuang [15] found that the growth of the copper chlorides on (111) Cu was essentially one dimensional. It has also been suggested by Kuo and Lee [32] that the growth of the layers in a RIE reactor was anisotropic. Bertz et al. [13] proposed that the Cu (111) texture can result in enhanced etch anisotropy and hence smoother sidewall profiles without the need for thick sidewall films can be obtained when the etching was carried out at 200° C. Similarly Miyazaki et al. [14] obtained an anisotropic etch without the need of protective side-wall films, when the etching was carried out using a single chlorine reactant at temperatures between 230 and 270° C. at pressures less than 2 Pa (approx. $2 \times 10^{-5}$ atm). In the present case, since very low temperatures are used, it is possible to use additives such as CCl$_4$, BCl$_3$ or SiCl$_4$ along with chlorine for the formation of protective sidewall films [8]. These additives need not be used if anisotropy in the growth of CuCl and CuCl$_2$ layers, as well as in the subsequent etching with hydrogen, can be achieved either due to the effect of texture or due to the basic anisotropic nature of the RIE process itself.

The efforts by Bertz et al. [13], Miyazaki et al. [14] and others [5, 24, 25], who appear to be utilizing the active oxidation (chlorination) of Cu at high temperatures, are different from the present approach. Kuo and Lee's two-step process [32,33] has some relevance since the authors do first promote the growth of the CuCl and CuCl$_2$ layers. However, the exposure times are quite long (2–3 minutes). As a result of these conditions, it is likely that the growth of their layers is likely to be near parabolic (hence slower) with a dominance of CuCl. The major difference is that in their process, the etching of the copper chloride layers is done using a HCl solution and hence it is not technically a "dry etch process". In contrast, the method of the subject invention is a truly dry process that is based on the hydrogen induced, metastable CuCl$_2$(c)-Cu$_3$Cl$_3$(g) vaporization reaction as the primary etching mechanism. Furthermore, the present method can be implemented at low temperatures (25° C.) and is a multi-step process in which the primary CuCl$_2$(c) growth and etching steps are repeated the required number of times so as to minimize the total etching time (FIG. 10).

Since the growth is assumed to be anisotropic, the volume changes are accommodated in the growth direction, the area being the same. In the schematic for Step I shown in FIG.

10(a), it is assumed that $L_{CuCl}/L_{CuCl_2}=3$. Since the ratio of the molar volumes are: $V_{CuCl}/V_{Cu}=3.36\approx3$ and $V_{CuCl_2}/V_{Cu}=5.57\approx6$, and the volume change is assumed to be anisotropic, the depth of penetration into copper equals ($\frac{1}{3}L_{CuCl}+\frac{1}{6}L_{CuCl_2}$). The positive expansion due to the volume changes results in a profile shown in FIG. 10(a), where the $CuCl_2$ layer and a large portion of the CuCl layer are at a higher level than the photoresist layer. A time $t_1$ is required for this initial step.

Step II:

In Step II the $CuCl_2$ layer is rapidly etched in time $t_2$ using a hydrogen plasma that contains a large amount of H radicals. Only the $CuCl_2$ layer should be etched during this step, since the etching of the CuCl layer is significantly slower according to the earlier analysis. One simple way for determining the endpoint of this step, is to monitor the partial pressure of $Cu_3Cl_3(g)$ in the exhaust stream although other sophisticated techniques (e.g., optical [9]) that can directly locate the $CuCl_2$/CuCl interface may also be utilized. An approximate value for the etch rate can be obtained using Langmuir's model (47) for the evaporation rate. For example, a $Cu_3Cl_3$ partial pressure of $10^{-3}$ atm obtained using $10^{-37}$ atm of atomic hydrogen at 50° C., results in an extraordinarily high Cu etch rate of 1000 μm/min. Obviously this is not the true or total etch rate of the process, which is primarily determined by the diffusion step.

Step III:

The freshly exposed CuCl layer is again subjected to a chlorine plasma. If it is desired to maintain the same ratio of the lengths of the two layers, the time required for this step $t_3$, should be much smaller than the time $t_1$, that is required for the growth of both layers during Step I. The amount of Cu etched during Step II is given by $\Delta l$, which is approximately ⅙ the length of the $CuCl_2$ layer etched (since $V_{CuCl_2}/V_{Cu}=5.57\approx6$). Thus in Step III, if the same length of the CuCl layer as in Step I is obtained, the distance $\Delta l$ of CuCl has penetrated into Cu. Steps II and III can then be repeated the desired number of times to obtain the required etch depth. As the thickness of the remaining Cu layer reduces during this repetitive process, a point is reached when the final Cu layer that is still to be etched, is converted to CuCl. This final CuCl layer in turn can be converted into $CuCl_2$ either in a single step and etched away or incrementally converted and etched. Thus one does not anticipate the etching of CuCl during any stage of the process, although this may still be performed at a much slower rate using the CuCl—CuH(g) volatilization reaction with a high concentration of H radicals. The total time for the copper etching process is primarily dependent on the time for the individual steps and the number of cycles involving Steps II and III.

$$t_{total} \approx nt_2 + nt_3 + n\delta t_{2-3} + n\delta t_{3-2} \quad (29)$$

where n is the number of times Steps II and III are repeated; $\delta t_{2-3}$ and $\delta t_{3-2}$ are the time intervals between Steps II and III, and III and II respectively. Alternative processing schemes that can reduce the total etching time while providing the desired dimensional profiles can also be utilized.

During the initial stages of the etching process, it may be desirable to reduce the time taken for the repetitive Steps II and III, since the positive volume change may result in the spilling over of the $CuCl_2$ and CuCl on top of the photoresist. Once a sufficient depth of Cu has been etched so that the volume change due to the formation of the CuCl and $CuCl_2$ is below the level of the photoresist layer, the desired cycle that minimizes the total time can be utilized. The success of the proposed etching scheme depends on two major factors: (a) the anisotropic growth of CuCl and $CuCl_2$ which appears to be the case according to Sesselmann and Chuang [15], Kuo and Lee [32–33], and Allen and Grant [34] and, (b) the rapid formation and growth of $CuCl_2$ which may be promoted by using plasma systems (e.g., ECR [27]) containing a high concentration of Cl radicals at low temperatures. The etch process itself, that is based on the $CuCl_2(c)$-$Cu_3Cl_3(g)$ metastable equilibrium in the presence of hydrogen, is not expected to be a limiting factor even at low temperatures.

The utilization of Cu halides as an alternative to the organometallic route for Chemical Vapor Deposition (CVD) of copper has been demonstrated [6, 46]. Bourhila et al. [46] deposited copper in the temperature range of 250–420° C. using a $Cu_3Cl_3$ precursor that was formed by the chlorination of copper at temperatures between 420–450° C. The chlorination of copper to synthesize $Cu_3Cl_3(g)$ had to be performed just above the deposition area due to the low vapor pressure of $Cu_3Cl_3(g)$. Based on the present analysis, the possibility of obtaining very high vapor pressures of $Cu_3Cl_3(g)$ at low temperatures by the hydrogen induced reduction of $CuCl_2(c)$, appears to offer some advantages for the purpose of Cu CVD. These include: (a) lower temperatures by using $CuCl_2(c)$ reduction with $H_2$ rather than Cu chlorination (although the unit cost for $CuCl_2$ is higher than Cu due to the additional chlorination step required for the formation of $CuCl_2$), (b) higher vapor pressures of $Cu_3Cl_3$ (g), (c) the possibility of recycling the $Cu_3Cl_3(g)$ formed during the subject process.

Unfortunately the presence of HCl(g) along with $Cu_3Cl_3$ (g) may not be beneficial from the viewpoint of Cu CVD, unless they can be separated. It is expected that Cu deposition at lower temperatures is favored, if the ratios of the atom fractions $X_{Cu}/X_{Cl}$, $X_{Cu}/X_H$ and $X_H/X_{Cl}$ in the gas mixture are as high as possible. Hence the utilization of the byproducts of the $CuCl_2(c)$-$Cu_3Cl_3(g)$ reduction reaction may be advantageous for Cu CVD. Preliminary thermodynamic computations using the HSC Chemistry software [29] indicate that the utilization of CuH(g) rather than $Cu_3Cl_3(g)$ as a precursor offers the benefit of very low temperatures (room temperatures) for Cu CVD.

At the present time several leading semiconductor companies appear to have already made a decision to adopt the damascene process. Judging from articles in some of the leading semiconductor magazines, the CMP step is regarded as the biggest problem in the success of the dual damascene technology for copper. With the implementation of low-K dielectric materials that may contain significant porosity, the problems with CMP are expected to get worse. A dry planarization process if available would be of immediate significance. The subject RIE process can be used as an alternative to Chemical Mechanical Planarization (CMP). The subject process may be utilized either for the dry etching of copper or for the planarization of copper in the damascene process. For the subject multi-step dry etch process to be able to also planarize, i.e., reduce the rms roughness, the etching of surface features should be in the following order: convex>flat>concave curvatures. Indeed one would expect this to be the case for the present process if one considers the Kelvin or Gibbs-Thomson effect in thermodynamics. According to the Kelvin effect, the chemical potential of chlorine on convex $CuCl_2$-gas interfaces is increased in relation to flat interfaces while that on concave interfaces is reduced. As a result one would expect the thicknesses of the $CuCl_2$ as well as the CuCl layers having convex surfaces to be enhanced as compared to concave surfaces. Since in the next step, the $CuCl_2$ layer is etched using hydrogen gas and the entire process repeated (discussed in Section V), the resultant interfacial roughness between the Cu and CuCl layers is expected to be progressively reduced. This phenomenon of surface smoothing has been observed in the case of thermal oxidation of silicon [59–61]. In fact Yahata et al. [59] have successfully utilized a similar process scheme involving sacrificial thermal oxidation of silicon followed by chemical dry etching in order to obtain very smooth silicon side-walls having rms roughnesses less than 1 nm. A more in-depth two-dimensional analysis of the thermal oxidation of silicon by Kao et al. [62,63] reveals that for shorter oxidation times as is the case with the present approach, curvature effects dominate over other effects that may influence thermal oxidation (see FIG. 17 in ref. [63]).

The conditions for the enhanced surface smoothing of copper need not be the same as those required for enhanced etching. Besides the plasma operating parameters, described in standard texts such as the one by Manos and Flamm [64], the temperature and the partial pressure of chlorine are expected to be the important variables that need to be optimized for the reactive ion planarization of copper. Since it is desirable to maintain a low temperature (25° C.), the partial pressure of chlorine is the major variable that needs to be controlled. One would expect the Kelvin effect to be more effective in causing surface smoothing for lower pressures of chlorine as compared to higher pressures that are preferable for faster etching. Hence an effective scheme for the RIP of copper may require two steps not necessarily in the order given: (a) surface smoothing with a low chlorine partial pressure and appropriate plasma parameters, (b) etching with a high chlorine partial pressure and plasma parameters that are similar to those utilized for the RIE of copper.

In case the electroplating of copper in the damascene process results in variations in thickness that are significantly larger than the starting surface roughness (imagine a trapezoid with roughened surfaces), an additional step prior to the previous steps is necessary to reduce these variations to the level of the surface roughness. To accomplish this, a gradient gas delivery system capable of delivering varying chlorine partial pressures as a function of height can be used. Since higher chlorine partial pressures result in thicker chloride layers, elevated regions of the deposited copper will be etched at a higher rate during the multi-step etch process. Once the thickness variations approach that of the surface roughness (imagine a rectangle with roughened surfaces) the two steps discussed earlier can be utilized. As is the case with CMP, the control of the end-point may present significant challenges for the RIP process. However it is felt that the RIP process offers greater ease and flexibility for this purpose.

TABLE 1

Thermodynamic Data Utilized for Construction of Volatility Diagrams in the Cu—Cl—H System ($T^0$ = 298.15 K, $P^0$ = 0.1 MPa).

| | | | | $Cp = A + BT + C/T^2 + DT^2$ | | | | |
|---|---|---|---|---|---|---|---|---|
| No. | Species | $S^0$ (J/deg mol) | $\Delta H^0$ (kJ/mol) | A | $B \times 10^3$ | $C \times 10^{-5}$ | $D \times 10^6$ | Ref. |
| | | | | | (J/deg mol) | | | |
| 1 | Cu(ref)(c) | 33.162 | 0 | 30.577 | −11.326 | −3.284 | 9.799 | HSC (36) |
| 2 | $Cl_2$(ref)(g) | 223 | 0 | 36.99 | 0.71 | −2.93 | 0 | Kuba (45) |
| 3 | $H_2$(ref)(g) | 130.679 | 0 | 25.855 | 4.837 | 1.584 | −0.372 | HSC |
| 4 | CuCl(c) | 87 | −137.2 | 38.28 | 34.98 | 0 | 0 | Kuba |
| 5 | $CuCl_2$(c) | 108.073 | −217.986 | 78.868 | 5.740 | −7.749 | −0.004 | HSC |
| 6 | Cu(g) | 166.398 | 337.599 | 20.786 | 0 | 0 | 0 | HSC |
| 7 | CuCl(g) | 237.191 | 91.211 | 37.275 | 0.540 | −1.954 | 0 | HSC |
| 8 | $CuCl_2$(g) | 278.416 | −43.267 | 61.798 | 0.138 | −4.510 | 0.293 | HSC |
| 9 | $Cu_3Cl_3$(g) | 429.517 | −246.438 | 132.763 | 0.138 | −7.36 | 0 | HSC |
| 10 | Cl(g) | 165.1 | 121.3 | 23.79 | −1.28 | −1.4 | 0 | Kuba |
| 11 | H(g) | 114.717 | 217.999 | 20.79 | 0 | 0 | 0 | HSC |
| 12 | HCl(g) | 186.895 | −92.312 | 26.576 | 5.697 | 0.713 | −0.674 | HSC |
| 13 | CuH(g) | 196.468 | 274.889 | 30.836 | 3.766 | −4.561 | 0 | HSC |

TABLE 2

Reactions Utilized for Plotting Volatility Diagrams in the Cu—Cl system.

| | | log (K) = −$\Delta G^0$/RT | | | | $\Delta H^0$ (kJ/mol) | | | |
|---|---|---|---|---|---|---|---|---|---|
| No. | Reaction | 50° C. | 100° C. | 150° C. | 200° C. | 50° C. | 100° C. | 150° C. | 200° C. |
| 1 | Cu(c) + ½ $Cl_2$(g) = CuCl(c) | 19.17 | 16.21 | 13.95 | 12.18 | −137.01 | −136.62 | −136.17 | −135.66 |
| 2 | CuCl(c) + ½ $Cl_2$(g) = $CuCl_2$(c) | 8.34 | 6.6 | 5.27 | 4.23 | −80.63 | −80.3 | −79.98 | −79.7 |
| 3 | Cu(c) = Cu(g) | −47.63 | −40.32 | −34.74 | −30.34 | 337.5 | 337.3 | 337.05 | 336.8 |
| 4 | CuCl(c) = Cu(g) + ½ $Cl_2$(g) | −66.80 | −56.52 | −48.69 | −42.51 | 474.52 | 473.91 | 473.22 | 472.46 |
| 5 | $CuCl_2$(c) = Cu(g) + $Cl_2$(g) | −75.13 | −63.12 | −53.96 | −46.74 | 555.15 | 554.2 | 553.2 | 552.16 |
| 6 | Cu(c) + ½ $Cl_2$(g) = CuCl(g) | −9.91 | −7.95 | −6.45 | −5.27 | 91.06 | 90.72 | 90.37 | 90.01 |
| 7 | CuCl(c) = CuCl(g) | −29.09 | −24.15 | −20.4 | −17.45 | 228.07 | 227.34 | 226.54 | 225.67 |
| 8 | $CuCl_2$(c) = CuCl(g) + ½ $Cl_2$(g) | −37.43 | −30.75 | −25.67 | −21.67 | 308.7 | 307.64 | 306.52 | 305.37 |
| 9 | Cu(c) + $Cl_2$(g) = $CuCl_2$(g) | 8.16 | 7.22 | 6.5 | 5.93 | −43.31 | −43.39 | −43.49 | −43.59 |
| 10 | CuCl(c) + ½ $Cl_2$(g) = $CuCl_2$(g) | −11.02 | −8.99 | −7.45 | −6.25 | 93.71 | 93.22 | 92.68 | 92.07 |
| 11 | $CuCl_2$(c) = $CuCl_2$(g) | −19.36 | −15.59 | −12.72 | −10.47 | 174.34 | 173.52 | 172.66 | 171.77 |
| 12 | 3Cu(c) + 3/2 $Cl_2$(g) = $Cu_3Cl_3$(g) | 39.61 | 34.27 | 30.19 | 26.97 | −246.43 | −246.47 | −246.55 | −246.66 |

TABLE 2-continued

Reactions Utilized for Plotting Volatility Diagrams in the Cu—Cl system.

| | | log (K) = −ΔG⁰/RT | | | | ΔH⁰ (kJ/mol) | | | |
|---|---|---|---|---|---|---|---|---|---|
| No. | Reaction | 50° C. | 100° C. | 150° C. | 200° C. | 50° C. | 100° C. | 150° C. | 200° C. |
| 13 | $3CuCl(c) = Cu_3Cl_3(g)$ | −17.91 | −14.35 | −11.66 | −9.56 | 164.61 | 163.38 | 161.95 | 160.32 |
| 14 | $3CuCl_2(c) = Cu_3Cl_3(g) + 3/2\ Cl_2(g)$ | −42.93 | −34.14 | −27.47 | −22.24 | 406.5 | 404.27 | 401.9 | 399.41 |

TABLE 3

Reactions to be Considered in the Presence of Hydrogen.

| | | log (K) = −ΔG⁰/RT | | | | ΔH⁰ (kJ/mol) | | | |
|---|---|---|---|---|---|---|---|---|---|
| No. | Reaction | 50° C. | 100° C. | 150° C. | 200° C. | 50° C. | 100° C. | 150° C. | 200° C. |
| 1 | $Cu(c) + \frac{1}{2}H_2(g) = CuH(g)$ | −39.33 | −33.39 | −28.86 | −25.29 | 274.6 | 274.04 | 273.52 | 273.02 |
| 2 | $Cu(c) + H(g) = CuH(g)$ | −6.64 | −5.45 | −4.54 | −3.83 | 56.44 | 55.56 | 54.72 | 53.90 |
| 3 | $CuCl(c) + \frac{1}{2}H_2(g) = CuH(g) + \frac{1}{2}Cl_2(g)$ | −58.51 | −49.59 | −42.81 | −37.47 | 411.61 | 410.66 | 409.68 | 408.68 |
| 4 | $CuCl(c) + H(g) = CuH(g) + \frac{1}{2}Cl_2(g)$ | −25.84 | −21.66 | −18.49 | −16.00 | 193.45 | 192.18 | 190.89 | 189.56 |
| 5 | $CuCl_2(c) + \frac{1}{2}H_2(g) = CuH(g) + Cl_2(g)$ | −66.85 | −56.19 | −48.08 | −41.69 | 492.24 | 490.95 | 489.67 | 488.37 |
| 6 | $CuCl_2(c) + H(g) = CuH(g) + Cl_2(g)$ | −34.18 | −28.25 | −23.76 | −20.23 | 274.08 | 272.48 | 270.87 | 269.26 |
| 7 | $3CuCl_2(c) + 3/2 H_2(g) = Cu_3Cl_3(g) + 3HCl(g)$ | 3.42 | 6.2 | 8.27 | 9.87 | 129.37 | 126.74 | 123.93 | 121.0 |
| 8 | $3CuCl_2(c) + 3H(g) = Cu_3Cl_3(g) + 3HCl(g)$ | 101.43 | 90 | 81.23 | 74.26 | −525.1 | −528.69 | −532.46 | −536.35 |
| 9 | $CuCl_2(c) + 3/2 H_2(g) = CuH(g) + 2HCl(g)$ | −35.95 | −29.3 | −24.25 | −20.28 | 307.49 | 305.93 | 304.35 | 302.77 |
| 10 | $CuCl_2(c) + 3H(g) = CuH(g) + 2HCl(g)$ | 62.06 | 54.51 | 48.71 | 44.1 | −346.98 | −349.5 | −352.03 | −354.58 |
| 11 | $CuCl(c) + H_2(g) = CuH(g) + HCl(g)$ | −43.06 | −36.15 | −30.89 | −26.76 | 319.23 | 318.14 | 317.03 | 315.87 |
| 12 | $CuCl(c) + 2H(g) = CuH(g) + HCl(g)$ | 22.28 | 19.73 | 17.75 | 16.16 | −117.08 | −118.81 | −120.56 | −122.36 |

TABLE 4

Effect of $R_{Cu}$, $R_{Cl}$ and Y on $\tilde{D}_{CuCl}/\tilde{D}_{CuCl_2}$ where $$R_{Cu} = \frac{D_{Cu}^{CuCl}}{D_{Cu}^{CuCl_2}},\ R_{Cl} = \frac{D_{Cl}^{CuCl}}{D_{Cl}^{CuCl_2}}\ \text{and}$$

$$Y = \frac{D_{Cu}^{CuCl}}{D_{Cl}^{CuCl}}\ \text{and}\ \frac{\tilde{D}_{CuCl}}{\tilde{D}_{CuCl_2}} = \frac{\frac{X_{Cu}^{CuCl}}{Y} + X_{Cl}^{CuCl}}{\frac{X_{Cu}^{CuCl_2}}{Y \cdot R_{Cl}} + \frac{X_{Cl}^{CuCl_2}}{R_{Cu}}}$$

| No. | $R_{Cu}$ | $R_{Cl}$ | Y | $\tilde{D}_{CuCl}/\tilde{D}_{CuCl_2}$ | Comments |
|---|---|---|---|---|---|
| 1 | 3 | 1/3 | 10 | 1.707 | — |
| 2 | 3 | 1/3 | 100 | 2.175 | — |
| 3 | 3 | 1/2 | 10 | 1.904 | — |
| 4 | 3 | 1/2 | 100 | 2.206 | — |
| 5 | 2 | 1/3 | 10 | 1.269 | — |
| 6 | 2 | 1/3 | 100 | 1.471 | — |
| 7 | 2 | 1/2 | 10 | 1.375 | — |
| 8 | 2 | 1/2 | 100 | 1.485 | — |
| 9 | 3 | 1 | 10 | 2.152 | $D_{Cl}^{CuCl} = D_{Cl}^{CuCl_2}$ |
| 10 | 3 | 1 | 100 | 2.239 | same |
| 11 | 1 | 1/3 | 10 | 0.717 | $D_{Cu}^{CuCl} = D_{Cu}^{CuCl_2}$ |
| 12 | 1 | 1/3 | 100 | 0.746 | same |
| 13 | 1 | 1 | 10 | 0.786 | $D_{Cu}^{CuCl} = D_{Cu}^{CuCl_2}$ and $D_{Cl}^{CuCl} = D_{Cl}^{CuCl_2}$ |
| 14 | 1 | 1 | 100 | 0.754 | same |

Appendix 1: Isomolar Point for the $CuCl_2(c)$-$Cu_3Cl_3(g)$ Vapor Pressure Line First consider the dissociation reaction $$3CuCl_2 = Cu_3Cl_3(g) + \frac{3}{2}Cl_2(g) \tag{A-1}$$

The equilibrium constant for the reaction is related to the activities or partial pressures of the species involved in the reaction.

$$\log K(T) = \log\left(\frac{P_{Cu_3Cl_3(g)} P_{Cl_2(g)}^{3/2}}{a_{CuCl_2(c)}^3}\right) \tag{A-2}$$

The equilibrium constant, K, for the reaction is a function of temperature. The activity of $CuCl_2(c)$ is unity assuming it to be in its standard state. Hence the partial pressure of $Cu_3Cl_3(g)$ is obtained as:

$$\log P_{Cu_3Cl_3} = \log K(T) - \frac{3}{2}\log P_{Cl_2} \tag{A-3}$$

The subscript (g) denoting a gas is henceforth omitted. According to the mass balance criterion $$P_{Cu_3Cl_3} = \frac{2}{3}P_{Cl_2} \text{ or } P_{Cl_2} = \frac{3}{2}P_{Cl_2} \tag{A-4}$$

Substituting in Eq. (A-3) and rearranging gives the partial pressure of $Cu_3Cl_3(g)$ at the isomolar point.

$$\log P_{Cu_3Cl_3}(T) = \frac{2}{5}\left(\log K(T) - \frac{3}{2}\log\frac{3}{2}\right) \tag{A-5}$$

Similarly the partial pressure of $Cl_2$ at the isomolar point is obtained.

$$\log P_{Cl_2}(T) = \frac{2}{5}\left(\log K(T) + \log\frac{3}{2}\right) \tag{A-6}$$

Hence the isomolar points at different temperatures can be plotted on the $CuCl_2(c)$-$Cu_3Cl_3(g)$ vapor pressure line as shown in FIG. 4.

Appendix 2: Isobaric Points for the $CuCl_2(c)$-$Cu_3Cl_3(g)$ Vapor Pressure Line In the presence of hydrogen, the $CuCl_2(c)$-$Cu_3Cl_3(g)$ dissociation reaction is $$3CuCl_2(c) + \frac{3}{2}H_2(g) = Cu_3Cl_3(g) + 3HCl(g) \tag{A-7}$$

The equilibrium constant is related to the activities as $$\log K(T) = \log\left(\frac{P_{Cu_3Cl_3(g)} P_{HCl(g)}^3}{a_{CuCl_2(c)}^3 P_{H_2(g)}^{\frac{3}{2}}}\right) \tag{A-8}$$

Assuming $CuCl_2(c)$ to be in its standard state, its activity is unity. Hence, $$\log P_{Cu_3Cl_3}(T, P_{H_2}) = \log K(T) - 3\log P_{HCl} + \frac{3}{2}\log P_{H_2} \tag{A-9}$$

The mass balance criterion for reaction (A-7) is $$P_{Cu_3Cl_3} = \frac{1}{3}P_{HCl} \text{ or } P_{HCl} = 3P_{Cu_3Cl_3} \tag{A-10}$$

Substituting for the partial pressure of HCl in Eq. (A-9) and simplifying, the partial pressure of $Cu_3Cl_3$ at the isobaric point is obtained as a function of temperature and partial pressure of hydrogen.

$$\log P_{Cu_3Cl_3}(T, P_{H_2}) = \frac{1}{4}\left(\log K(T) - 3\log 3 + \frac{3}{2}\log P_{H_2}\right) \tag{A-11}$$

The partial pressure of HCl at the isobaric point is given by $$\log P_{HCl}(T, P_{H_2}) = \log 3 = \log P_{Cu_3Cl_3}(T, P_{H_2}) \tag{A-12}$$

The partial pressure of $Cl_2$ at the isobaric point is obtained from Eq. (A-3).

$$\log P_{Cl_2}(T, P_{H_2}) = \frac{2}{3}(\log K(T) - \log P_{Cu_3Cl_3}(T, P_{H_2})) \tag{A-13}$$

Hence for a given partial pressure of hydrogen, the isobaric points at different temperatures can be obtained (FIG. 5). A similar procedure can be employed to obtain the isobaric points in case atomic hydrogen is used (FIG. 6).

REFERENCES

1. S. P. Murarka and S. W. Hymes, *Critical Reviews in Solid State and Materials Sciences*, 20, 87 (1995).
2. R. Rosenberg, D. C. Edelstein, C. K. Hu, and K. P. Rodbell, *Annu. Rev. Mater. Sci.*, 30, 229 (2000).
3. C. Steinbrüchel, *Appl. Surf. Sci.*, 91, 139 (1995).
4. J. Li, T. E. Seidel and J. W. Mayer, *MRS Bulletin*, 19, 15 (1994).
5. Y. Arita, N. Awaya, K. Ohno, and M. Sato, *MRS Bulletin*, 19, 68 (1994).
6. N. Bourhila, J. Torres, C. Palleau, C. Bernard, and R. Madar, *Microelectron. Eng.*, 33, 25 (1997).
7. J. Torres, J. L. Mermet, R. Madar, G. Crean, T. Gessner, A. Bertz, W. Haase, M. Plotner, F. Binder, and D. Save, *Microelectron. Eng.*, 34, 119 (1996).
8. W. E. Frank, *Microelectron. Eng.*, 33, 85 (1997).

9. K. G. Donohue, T. Turner and K. A. Jackson in "Handbook of SemiConductor Technology," K. A. Jackson and W. Schroter, Editors, p. 291, Wiley-VCH, Weinheim (2000).
10. R. H. Bruce and G. P. Malafsky, *J. Electrochem. Soc.,* 130, 1369 (1983).
11. M. Markert, A. Bertz and T. Gessner, *Microelectron. Eng.,* 35, 333 (1997).
12. M. Markert, A. Bertz and T. Gessner, Y. Ye, A. Zhao, and D. Ma, *Microelectron. Eng.,* 50, 417 (2000).
13. A. Bertz, M. Markert and T. Gessner, *Microelectron. Eng.,* 33, 203 (1997).
14. H. Miyazaki, K. Takeda, N. Sakuma, S. Kondo, Y. Homma, and K. Hinode, *J. Vac. Sci. Technol. B,* 15, 237 (1997).
15. W. Sesselmann and T. J. Chuang, *Surf. Sci.,* 176, 32 (1986).
16. G. Banerjee, J. So and B. Mikkola, *Solid State Technol.,* 44, 83, (2001).
17. A. E. Braun, *Semiconductor International,* 23, 66 (2000).
18. S. Wang, G. Grover, C. Baker, J. Chamberlain, and C. Yu, *Solid State Technol.,* 44, S9, (2001).
19. A. E. Braun, *Semiconductor International,* 23, 60 (2000).
20. B. Maag, D. Boning and B. Voelker, *Semiconductor International,* 23, 101 (2000).
21. J. H. Golden, R. Small, L. Pagan, C. Shang, and S. Ragavan, *Semiconductor International,* 23, 85 (2000).
22. S. Guha, A. Sethuraman, Y. Gotkis, R. Kistler, and S. Steckenrider, *Solid State Technol.,* 44, 63, (2001).
23. H. F. Winters, *J. Vac. Sci. Technol. A,* 3, 786 (1985).
24. Y. Igarashi, T. Yamanobe and T. Ito, *Thin Solid Films,* 262, 124 (1995).
25. Y. Ye, A. Zhao, X. Deng, and D. X. Ma, U.S. Pat. No. 6,008,140 (1999).
26. A. Jain, T. T. Kodas and M. J. Hampden-Smith, *Thin Solid Films,* 269, 51 (1995).
27. S. K. Lee, S. S Chun, C. Y. Hwang, and W. J. Lee, *Jpn. J. Appl. Phys.,* 36, 50 (1997).
28. M. S. Kwon and J. Y. Lee, *J. Electrochem. Soc.,* 146, 3119 (1999).
29. M. S. Kwon, J. Y. Lee, K. S. Choi, and C. H. Han, *Jpn. J. Appl. Phys.,* 37, 4103 (1998).
30. Y. Ohshita and N. Hosoi, *Thin Solid Films,* 262, 67 (1995).
31. D. Debarre, A. Aliouchouche, J. Boulmer, B. Bourguignon, and J. P. Budin, *Appl. Surf. Sci.,* 96–98, 453 (1996).
32. Y. Kuo and S. Lee, *Jpn. J. Appl. Phys.,* 39, L188 (2000).
33. Y. Kuo and S. Lee, *Appl. Phys. Lett.,* 78, 1002 (2001).
34. L. R. Allen and J. M. Grant, U.S. Pat. No. 05,736,002 (1998).
35. NIST-JANAF Thermochemical Tables, $4^{th}$ ed., M. W. Chase, Jr., Editor, Am. Chem. Soc. & Am. Inst. Phys. for NIST, Maryland (1999).
36. HSC Chemistry for Windows (ver. 4.1): Chemical Reaction and Equilibrium Software with Extensive Thermochemical Database., Outokumpu Research Oy, Finland.
37. Facility for the Analysis of Chemical Thermodynamics (F*A*C*T), Ecole Polytechnique, Montreal, Quebec, Canada.
38. R. T. DeHoff, "Thermodynamics in Materials Science," McGraw-Hill, New York, N.Y. (1993).
39. C. Wagner, *J. Appl. Phys.,* 29, 1295 (1958).
40. E. A. Gulbransen, *Corrosion,* 26, 19 (1970).
41. E. A. Gulbransen and S. A. Jansson, *Oxid. Metals,* 4, 181 (1972).
42. S. A. Jansson, *J. Vac. Sci. Technol.,* 7, S5 (1970).
43. V. L. K. Lou, T. E. Mitchell and A. H. Heuer, *J. Am. Ceram. Soc.,* 68, 49 (1985).
44. V. L. K. Lou and A. H. Heuer, *J. Am. Ceram. Soc.,* 73, 2785 (1990).
45. I. Barin and O. Knacke, "Thermochemical Properties of Inorganic Substances," Springer-Verlag, New York (1973).
46. I. Barin, "Thermochemical Data of Pure Substances," V C H, Weinheim, Germany, 1989.
47. O. Kubaschewski, C. B. Alcock and P. J. Spencer, "Materials Thermochemistry," $6^{th}$ ed., Pergamon Press (1993).
48. C. V. Robino, *Metall. Trans. B,* 27B, 65 (1996).
49. D. R. Gaskell, *Metall. Trans. B,* 27B, 693 (1996).
50. K. T. Jacob, A. Chandran and R. M. Mallya, *Z. Metallkunde.,* 91, 401 (2000).
51. J. X. M. Zheng-Johansson, K. Sköld, *Solid State Ionics,* 70/71, 522 (1994).
52. J. W. Coburn, in "Handbook of Advanced Plasma Processing Techniques," R. J. Shul and S. J. Pearton, Editors, p. 1, Springer-Verlag, New York, N.Y. (2000).
53. C. Y. Nakakura, V. M. Phanise and E. I. Altman, *Surf. Sci.,* 370, L149 (1997).
54. F. M. d'Heurle and FTE, KTH-Electrum, in "Diffusion in Ordered Alloys," B. Fultz, R. W. Cahn, and D. Gupta, Editors, p. 185, The Minerals, Metals & Materials Society (TMS), Warrendale, Pa. (1993).
55. D. P. Tracy, D. B. Knorr and K. P. Rodbell, *J. Appl. Phys.,* 76, 2671 (1994).
56. D. P. Tracy and D. B. Knorr, *J. Electron. Mater.,* 22, 611 (1993).
57. D. H. Wang, S. Chiao, M. Afnan, P. Yih, and M. Rehayem, *Solid State Technol.,* 44, 101, (2001).
58. S. P. Mukherjee, J. A. Levert and D. S. DeBear, *Materials Research Society Symposium Proceedings,* 613, E8.10.1 (2000).
59. A. Yahata, S. Urano, T. Inoue, and T. Shinohe, *Jpn. J. Appl. Phys.,* 37, 3954 (1998).
60. S. J. Fang, W. Chen, T. Yamanaka, and C. R. Helms, *J. Electrochem. Soc.,* 144, 2886 (1997).
61. C. Zhao, P. R. Lefebvre and E. A. Irene, *Thin Solid Films,* 313–314, 286 (1998).
62. D-B. Kao, J. P. McVittie, W. D. Nix, and K. C. Saraswat, *IEEE Trans. on Electron Devices,* ED-34, 1008 (1987).
63. D-B. Kao, J. P. McVittie, W. D. Nix, and K. C. Saraswat, *IEEE Trans. on Electron Devices,* ED-35, 25 (1988).
64. D. L. Flamm and G. K. Herb, in "Plasma Etching—An Introduction," D. M. Manos and D. L. Flamm, Editors, pp. 1–184, Academic Press, New York, N.Y. (1989).

What is claimed is:

1. A method for etching copper, comprising:
    passing a halide gas over an area of Cu, wherein when the halide gas is passed over the area of Cu, CuX and $CuX_2$ are formed on the area of Cu;
    passing a reducing gas over the area of Cu for a sufficient time to etch away at least a portion of the $CuX_2$; and
    sequentially repeating passing a halide gas over the area of Cu and passing a reducing gas over the area of Cu, until a desired Cu etch depth is reached.

2. The method according to claim 1, wherein the area of Cu is a Cu layer, and passing a halide gas over the area of Cu and passing a reducing gas over the area of Cu are sequentially repeated until the Cu layer is etched through.

3. The method according to claim 2, wherein a surface of the area of Cu is smoothed.

4. The method according to claim 1, wherein passing a reducing gas over the area of Cu is accomplished so as to be on a $CuX_2$—$Cu_3X_3(g)$ metastable line.

5. The method according to claim 1, wherein X is selected from the group consisting of: Cl, F, Br, and I.

6. The method according to claim 1, wherein the halide gas is a chlorine gas.

7. The method according to claim 1, wherein the halide gas passed over the area of Cu is at a pressure between about 20 milliTorr and about 400 milliTorr.

8. The method according to claim 1, wherein the halide gas is a chlorine gas wherein the chlorine gas is a chlorine gas plasma, wherein the chlorine gas plasma is produced via a plasma system selected from the group consisting of: RIE, ICP, and ECR.

9. The method according to claim 1, wherein when the halide gas is passed over the area of Cu, the Cu is at a temperature of less than about 25° C.

10. The method according to claim 6, wherein when the chlorine gas is passed over the area of Cu, the Cu is at a temperature of less than about 50° C.

11. The method according to claim 6, wherein when the chlorine gas is passed over the area of Cu, the Cu is at a temperature of less than about 0° C.

12. The method according to claim 6, wherein when the chlorine gas is passed over the exposed area of Cu, the Cu is at a temperature of less than about −100° C.

13. The method according to claim 6, wherein when the chlorine gas is passed over the exposed area of Cu, the Cu is at a temperature of less than about 150° C.

14. The method according to claim 6, wherein when the chlorine gas is passed over the exposed area of Cu, the Cu is at a temperature of less than about −200° C.

15. The method according to claim 1, wherein passing a halide gas over the area of Cu comprises passing a halide gas plasma over the area of Cu.

16. The method according to claim 6, wherein the chlorine gas comprises a chlorine radical.

17. The method according to claim 16, wherein the chlorine radical is selected from the group consisting of: $Cl_2$, Cl, $Cl^-$, and $Cl^+$.

18. The method according to claim 1, wherein the reducing gas comprises a reducing gas plasma.

19. The method according to claim 6, wherein the chlorine gas passed over the area of Cu is at a pressure that allows the formation of CuCl and $CuCl_2$.

20. The method according to claim 1, wherein the halide gas comprises a mixture of halides.

21. The method according to claim 1, wherein the reducing gas is a hydrogen plasma.

22. The method according to claim 1, wherein the reducing gas is passed over area of the Cu for a sufficient time to etch essentially all of the $CuX_2$.

* * * * *

UNITED STATES PATENT AND TRADEMARK OFFICE
CERTIFICATE OF CORRECTION

PATENT NO.      : 7,064,076 B2
APPLICATION NO. : 10/285179
DATED           : June 20, 2006
INVENTOR(S)     : Nagraj Kulkarni It is certified that error appears in the above-identified patent and that said Letters Patent is hereby corrected as shown below:

Column 3,
Line 16, "had to carefully" should read --had to be carefully--.

Column 4,
Line 55, "etch partial into" should read --etch partially into--.

Column 6,
Line 39, "FIG. 9 is volatility diagram" should read --FIG. 9 is a valatility--.

Column 7,
Line 4, "etching CuX2" should read --etching $CuX_2$--.

Column 7,
Line 10, "etch partial into a layer" should read --etch partially into a layer--.

Column 9,
Line 45, "tinder which" should read --under which--
Line 51, "if afresh" should read --if a *fresh*--.

Column 10,
Lines 44-45, "than $10^{-5}$ atm." should read --than $10^{-50}$ atm.--.

Column 14,
Line 37 "=$CU_3Cl_3(g) + 3/2\ Cl_2(g)$" should read -- = $Cu_3Cl_3(g) + 3/2\ Cl_2(g)$--.

Column 15
Line 8, " $P_{Cu3Cl3(g)} = 10^{-171}$ and $P_{Cl2(g)} = 10^{-173}$ atm" should read
--$P_{Cu3Cl3(g)} = 10^{-17.1}$ and $P_{Cl2(g)} = 10^{-17.3}$ atm--.

Column 15,
Lines 46, " $P_{Cu3Cu3(g)} = 1/3\ P_{HCl(g)}$" should read -- $P_{Cu3Cl3(g)} = 1/3\ P_{HCl(g)}$ --.

Column 16,
Line 66, "$10^{7\ 1}$ atm" should read --$10^{7.1}$ atm--.

Column 17,
Line 48, "$P^H < 10^{-18}$ atm" should read --$P_H < 10^{-18}\ atm$--.

Column 29,
Line 34, "$P_{Cl2} = \frac{3}{2} P_{Cl2}$" should read --$P_{Cl2} = \frac{3}{2} P_{Cu3Cl3}$ --.

UNITED STATES PATENT AND TRADEMARK OFFICE
CERTIFICATE OF CORRECTION

PATENT NO. : 7,064,076 B2
APPLICATION NO. : 10/285179
DATED : June 20, 2006
INVENTOR(S) : Nagraj Kulkarni It is certified that error appears in the above-identified patent and that said Letters Patent is hereby corrected as shown below:

Column 30,
Line 36 " $= \log 3 = \log P_{Cu_3Cl_3}(T, P_{H_2})$" should read -- $= \log 3 + \log P_{Cu_3Cl_3}(T, P_{H_2})$ --.

Column 34,
Claim 13, line 3, "about 150° C" should read --about -150° C--.

Signed and Sealed this

Fifth Day of December, 2006

JON W. DUDAS
*Director of the United States Patent and Trademark Office*